United States Patent
Huang et al.

(10) Patent No.: US 11,257,924 B2
(45) Date of Patent: Feb. 22, 2022

(54) METAL GATE USING MONOLAYERS

(71) Applicant: Taiwan Semiconductor Manufacturing Co., Ltd., Hsinchu (TW)

(72) Inventors: Ju-Li Huang, Mingjian Township (TW); Chun-Sheng Liang, Puyan Township (TW); Ming-Chi Huang, Zhubei (TW); Ming-Hsi Yeh, Hsinchu (TW); Ying-Liang Chuang, Zhubei (TW); Hsin-Che Chiang, Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 128 days.

(21) Appl. No.: 16/746,097

(22) Filed: Jan. 17, 2020

(65) Prior Publication Data
US 2020/0152772 A1     May 14, 2020

Related U.S. Application Data

(62) Division of application No. 15/909,847, filed on Mar. 1, 2018, now Pat. No. 10,541,317.

(51) Int. Cl.
*H01L 29/66*      (2006.01)
*H01L 29/78*      (2006.01)
(Continued)

(52) U.S. Cl.
CPC .. *H01L 29/66545* (2013.01); *H01L 21/31111* (2013.01); *H01L 21/31144* (2013.01);
(Continued)

(58) Field of Classification Search
CPC .......... G03F 1/42; G03F 9/708; G03F 9/7084; G03F 7/70741; G03F 7/70633; G03F 1/00; G03F 7/70475; H01L 23/544; H01L 21/56; H01L 21/682; H01L 2223/54426; H01L 2021/60; H01L 21/76816; H01L 21/76808;
(Continued)

(56) References Cited

U.S. PATENT DOCUMENTS 9,431,304 B2     8/2016    Huang et al.
9,761,684 B2     9/2017    Huang et al.
(Continued)

OTHER PUBLICATIONS

U.S. Appl. No. 62/527,806; Entitled: High Selectivity Wet Patterning Process To Pattern Composite Work Function Metal Layers, filed Jun. 30, 2017.
(Continued)

*Primary Examiner* — Nelson Garces
(74) *Attorney, Agent, or Firm* — Slater Matsil, LLP

(57) ABSTRACT

Methods for, and structures formed by, wet process assisted approaches implemented in a replacement gate process are provided. Generally, in some examples, a wet etch process for removing a capping layer can form a first monolayer on the underlying layer as an adhesion layer and a second monolayer on, e.g., an interfacial dielectric layer between a gate spacer and a fin as an etch protection mechanism. Generally, in some examples, a wet process can form a monolayer on a metal layer, like a barrier layer of a work function tuning layer, as a hardmask for patterning of the metal layer.

20 Claims, 36 Drawing Sheets

(51) Int. Cl.
  *H01L 21/311* (2006.01)
  *H01L 21/3213* (2006.01)
  *H01L 21/8234* (2006.01)
  *H01L 21/321* (2006.01)
  *H01L 21/3105* (2006.01)
  *H01L 21/02* (2006.01)
  *H01L 21/027* (2006.01)

(52) U.S. Cl.
  CPC .. *H01L 21/32133* (2013.01); *H01L 21/32139* (2013.01); *H01L 21/82345* (2013.01); *H01L 21/823431* (2013.01); *H01L 29/66795* (2013.01); *H01L 29/7851* (2013.01); *H01L 21/0206* (2013.01); *H01L 21/02068* (2013.01); *H01L 21/0276* (2013.01); *H01L 21/31053* (2013.01); *H01L 21/3212* (2013.01); *H01L 29/6656* (2013.01); *H01L 29/66636* (2013.01)

(58) Field of Classification Search
  CPC ......... H01L 21/76898; H01L 2924/181; H01L 2924/15311; H01L 2224/16225; H01L 21/32139; H01L 21/31111; H01L 21/31144; H01L 21/32133; H01L 21/0206; H01L 21/02068; H01L 21/31053; H01L 21/3212; H01L 21/0276; H01L 29/66545; H01L 29/7851; H01L 29/66795; H01L 29/66636; H01L 29/6656
  See application file for complete search history.

(56) References Cited

U.S. PATENT DOCUMENTS

| | | |
|---|---|---|
| 2008/0289261 A1 | 11/2008 | Hattori et al. |
| 2016/0181163 A1* | 6/2016 | Huang ............ H01L 21/823857 257/369 |
| 2019/0252511 A1* | 8/2019 | Clendenning ..... H01L 23/53223 |

OTHER PUBLICATIONS

Khalafi-Nehad et al.; Preparation of silica boron-acid nanoparticles (SBAN) and silica boron-sulfuric acid nanoparticles (SBSANs) catalyst; J. Mater. Chem., 2011,21, 12842-12851.

Larsen et al.: Highly Selective Enrichment of Phosphorylated Peptides from Peptide Mixtures Using Titanium Dioxide Microcolumns, Mol. Cell. Proteomics 2005, 4, 873-886.

Textor et al.: Structural Chemistry of Self-Assembled Monolayers of Octadecylphosphoric Acid on Tantalum Oxide Surfaces; Langmuir 2000, 16, 3257-3271.

\* cited by examiner

METAL GATE USING MONOLAYERS

PRIORITY CLAIM AND CROSS-REFERENCE

This application is a divisional of U.S. application Ser. No. 15/909,847, filed on Mar. 1, 2018, which application is hereby incorporated herein by reference.

BACKGROUND

As the semiconductor industry has progressed into nanometer technology process nodes in pursuit of higher device density, higher performance, and lower costs, challenges from both fabrication and design have resulted in the development of three dimensional designs, such as fin field effect transistors (FinFETs). A typical FinFET is fabricated with a fin structure extending from a substrate, for example, by etching into, e.g., silicon of the substrate. The channel of the FinFET is formed in the vertical fin. A gate structure is provided over (e.g., overlying to wrap) the fin structure. It is beneficial to have a gate structure on the channel allowing gate control of the channel. FinFET devices provide numerous advantages, including reduced short channel effects and increased current flow.

As the device dimensions continue scaling down, FinFET device performance can be improved by using a metal gate electrode instead of a typical polysilicon gate electrode. One process of forming a metal gate stack is forming a replacement-gate process (also called as a "gate-last" process) in which the final gate stack is fabricated "last".

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
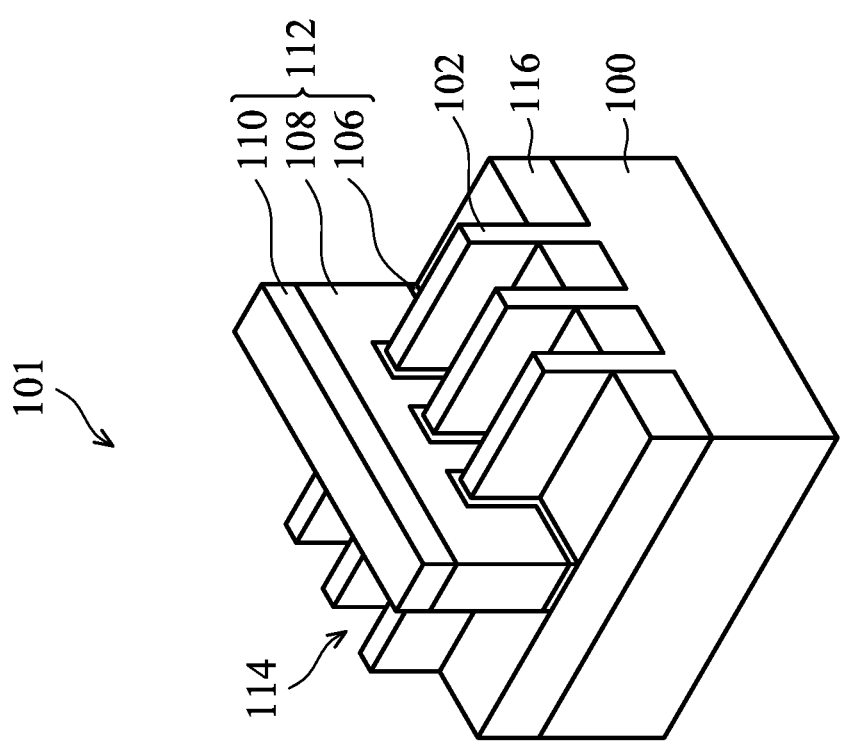
FIGS. 1, 2A, 2B, and 2C depict views of a semiconductor device structure at different manufacturing stages in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices, and more particularly to replacement gate structures formed in semiconductor devices. The present disclosure provides methods for, and structures formed by, wet process assisted approaches implemented in a replacement gate process.

In some examples, the present disclosure provides methods for, and structures formed by, a wet process assisted approach to form an etch protection mechanism of various features during a replacement gate process. For example, an interfacial dielectric layer may be susceptible to etchants through a weak point in or between layers formed during a replacement gate process when a silicon cap is removed from a gate dielectric layer. An etch protection mechanism described herein may be formed at, e.g., the interfacial dielectric layer by a wet process to form an etch protection mechanism during the removal of the silicon cap. In further examples, the wet process can form an adhesion layer in the replacement gate structure.

In some examples, the present disclosure provides methods for, and structures formed by, wet process assisted approaches to selective barrier layer and/or work function tuning layer patterning in a replacement gate process. For example, wet process assisted approaches can allow for selective formation of a hardmask layer by reacting a species with the barrier layer or work function layer, which can subsequently allow for removal of the barrier layer or work function layer where the species was not reacted with the barrier layer or work function layer.

Some examples described herein are in the context of FinFETs. In other implementations, aspects of various methods described herein may be implemented in vertical, gate all around (VGAA) devices, horizontal, gate all around (HGAA) devices, or other devices. Further, embodiments may be implemented in any advanced technology nodes or other technology nodes.

In a replacement gate process for forming a replacement gate structure for a transistor, a dummy gate stack is formed over a substrate as a placeholder for an actual replacement gate structure that is subsequently formed. A gate spacer is formed along sidewalls of the dummy gate stack. After source/drain regions are formed in the substrate (such as fins on the substrate) and after an interlayer dielectric (ILD) is formed on to the gate spacer, the dummy gate stack is removed, leaving an opening defined, at least in part, by the gate spacer and ILD. Then, a replacement gate structure is formed in the opening.

The replacement gate structure can include various layers, such as a gate dielectric layer (like a high-k (dielectric constant) dielectric layer), a barrier layer, a capping layer, a self-assembled layer, a work function tuning layer, and a gate metal fill, as described subsequently herein. Multiple deposition and patterning processes may be used to form the various layers, and the various layers may be implemented to fine tune threshold voltage (Vt) of the transistor formed with the replacement gate structure. In some embodiments, the work function tuning layer(s) may utilize different materials for different types of transistors, such as a p-type FinFET or n-type FinFET, so as to enhance device electrical performance as needed.

FIG. 1 shows the substrate 100 having a dummy gate stack 112 formed over a plurality of fins 102 formed on the substrate 100. The substrate 100 can be or include a bulk semiconductor substrate, a semiconductor-on-insulator (SOI) substrate, or another substrate. The semiconductor material of the substrate 100 can include or be a material selected from at least one of silicon (e.g., crystalline silicon like Si<100> or Si<111>), SiGe, Ge, GaAs, or another semiconductor material. The semiconductor material may be doped or undoped, such as with a p-type or an n-type dopant.

Each fin 102 provides an active region with which one or more devices (e.g., FinFETs) are formed. The fins 102 can be fabricated using suitable processes including photolithography and etch processes to etch recesses 114 into the substrate 100 and thereby form the fins 102. In some examples, the fins 102 comprise an elementary semiconductor, such as silicon or germanium; a compound or alloy semiconductor, such as SiGe, SiP, SiC, SiCP, GaAs, GaP, GaAsP, InP, InAs, AlInAs, AlGaAs, GaInAs, GaInP, GaInAsP, or InSb; or a combination thereof.

The recesses 114 may then be filled with isolating material that is recessed or etched back to form isolation structures 116. The isolation structures 116 may isolate some regions of the substrate 100, e.g., active areas in the fins 102. In an example, the isolation structures 116 may be shallow trench isolation (STI) structures and/or other suitable isolation structures. The isolation structures 116 may be formed of silicon oxide, silicon nitride, silicon oxynitride, fluoride-doped silicate glass (FSG), a low-k dielectric material, and/or other suitable insulating material. The STI structures may include a multi-layer structure, for example, having one or more liner layers. Other fabrication techniques for the isolation structures 116 and/or the fins 102 are possible.

A dummy gate stack 112 is formed over the fins 102. In the example depicted in FIG. 1, the dummy gate stack 112 includes an interfacial dielectric layer 106, a dummy gate layer 108, and a hardmask layer 110. The various layers in the dummy gate stack 112 may be formed by suitable deposition techniques and patterned by suitable photolithography and etching techniques. The term, "dummy", as described here, refers to a sacrificial structure which will be removed in a later stage and will be replaced with another structure, such as including a replacement gate structure. The interfacial dielectric layer 106 can be a dielectric oxide layer. The dummy gate layer 108 may be a poly-silicon layer or other suitable layer. The hardmask layer 110 may be any material suitable to pattern the dummy gate stack 112 with desired features/dimensions on the substrate.

In an embodiment, the various layers of the dummy gate stack 112 are first deposited as blanket layers. Then, the blanket layers are patterned through a process including photolithography and etch processes that remove portions of the blanket layers and keeps the remaining portions over the isolation structures 116 and the fins 102 to form the dummy gate stack 112. Although the interfacial dielectric layer 106 is depicted in FIG. 1 for ease of illustration as being removed from the fins 102 except in regions disposed between the dummy gate layer 108 and the respective fin 102, the interfacial dielectric layer 106 remains covering the fins 102.

Figure 2A:
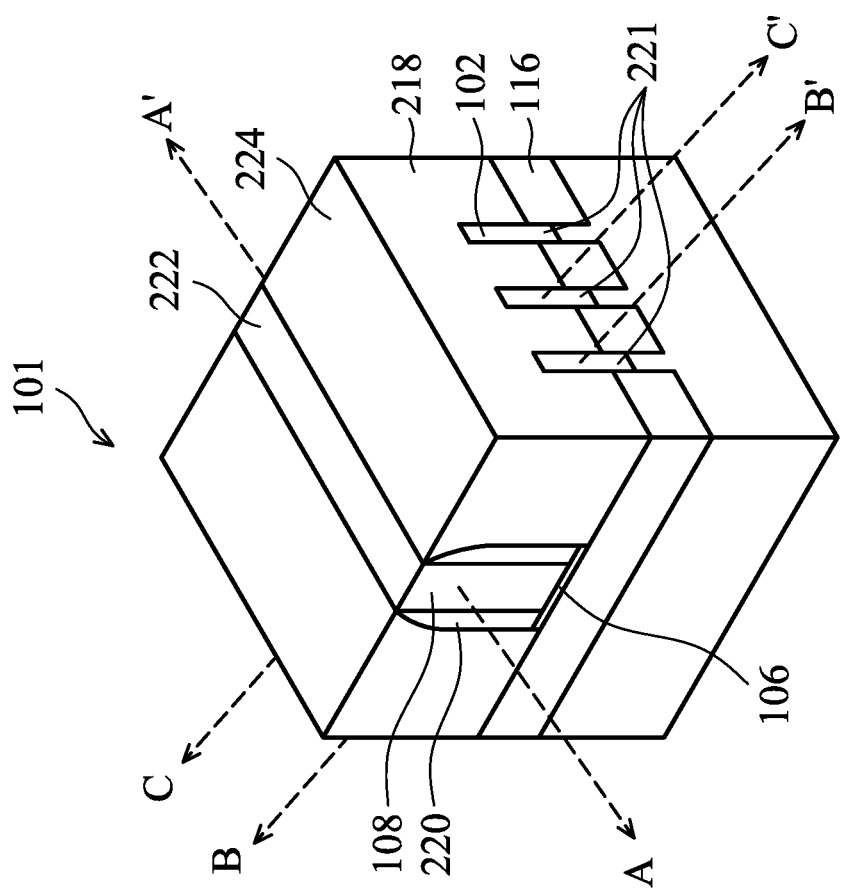
Figure 2B:
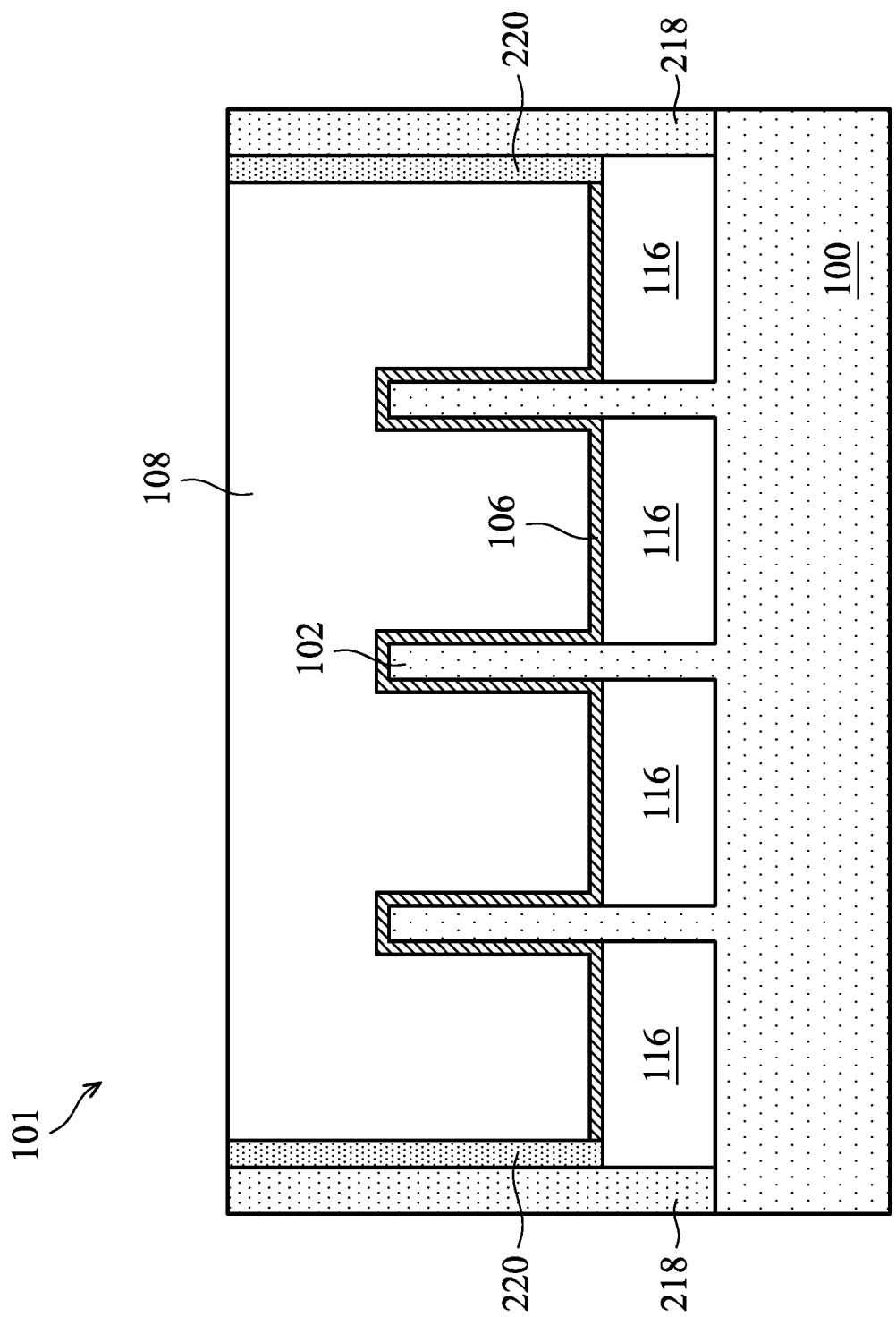
Figure 2C:
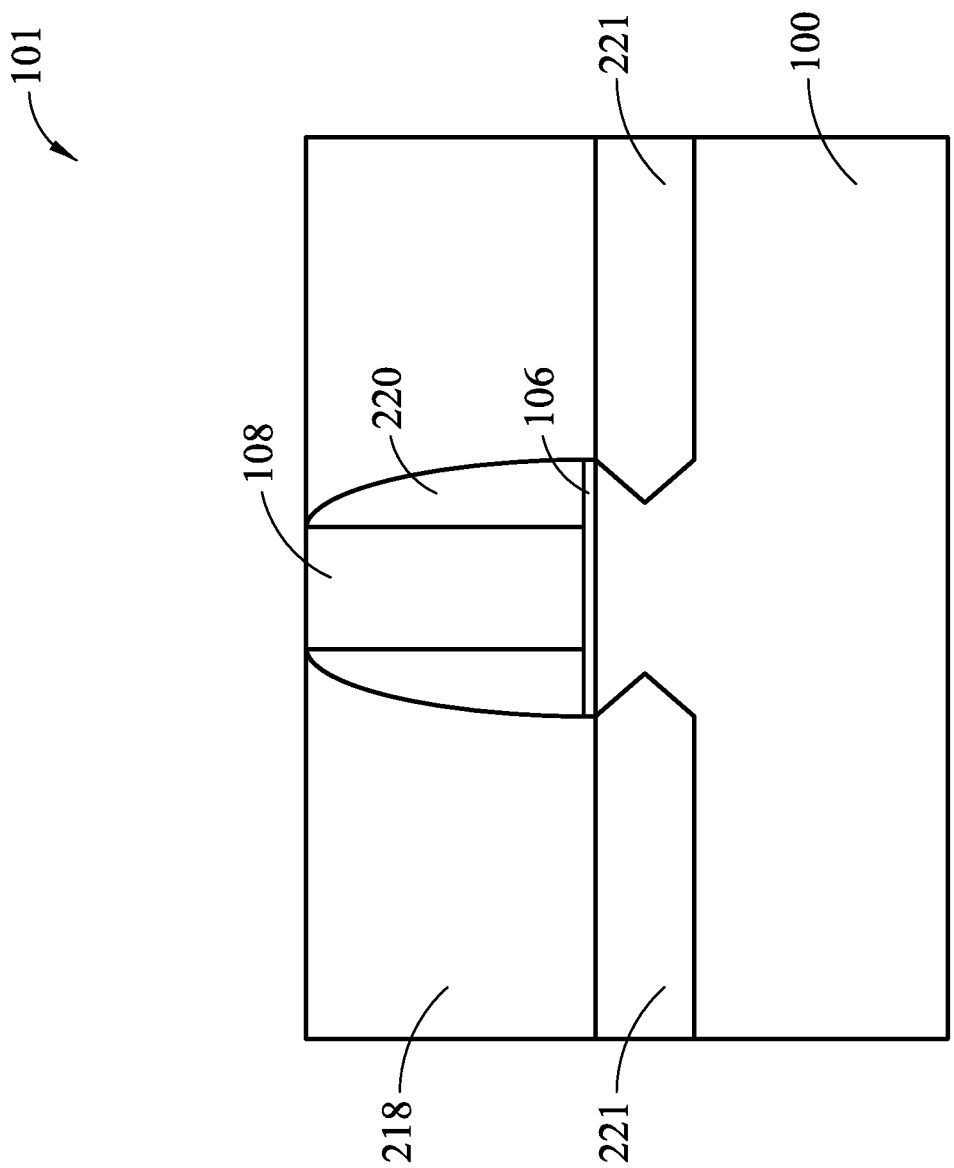

FIG. 2A depicts a three-dimensional view of the structure of FIG. 1 after further processing and with lines A-A', B-B', C-C' therethrough. Line A-A' is along a longitudinal axis of the dummy gate stack 112 and across channel regions of the fins 102. Line B-B' is along a longitudinal axis of a first fin 102, such as along source/drain regions 221 and a channel region in the first fin 102. Line C-C' is along a longitudinal axis of a second fin 102, such as along source/drain regions 221 and a channel region in the second fin 102. Lines B-B' and C-C' are perpendicular to the line A-A'. FIG. 2B and subsequent figures ending in an "A" designation correspond to the cross-section at line A-A'; FIG. 2C and subsequent figures ending in a "B" designation correspond to the cross-section at line B-B'; and subsequent figures ending in a "C" designation correspond to the cross-section at line C-C'. The cross-section corresponding to line C-C' is not illustrated by a separate figure during some processing described below; however, for such processing, the cross-section at line C-C' would be the same as the cross-section of line B-B', such as for FIGS. 3B, 4B, and 5B. As described in more detail subsequently, FIG. 2A does not illustrate some features that are present along line A-A' to avoid obscuring or occluding various features of the structure in FIG. 2A.

In FIGS. 2A, 2B, and 2C, a gate spacer 220 is formed on sidewalls of the dummy gate stack 112. The gate spacer 220 includes a material different from the material(s) for the dummy gate stack 112. In an embodiment, the gate spacer 220 includes a dielectric material, such as silicon nitride (SiN), silicon oxynitride (SiON), silicon carbon nitride (SiCN), silicon oxycarbonitride (SiOCN), or the like. In an example, the gate spacer 220 may be a single layer or multiple layers. In an embodiment, after the dummy gate stack 112 is formed, one or more spacer layers are formed by conformally depositing spacer layers over the device structure 101. Subsequently, an anisotropic etch process is performed to remove portions of the spacer layers to form the gate spacer 220.

After the gate spacer 220 is formed, recessing and an epitaxial growth processes may be performed to form epitaxy source/drain regions 221. Recesses are etched in the fins 102 for source/drain regions 221 proximate the dummy gate stack 112 while the dummy gate stack 112 and gate spacer 220 act as a mask. The recesses are formed in the fins 102 on opposing sides of the dummy gate stack 112. The recessing can be by any suitable etch process, which can form recesses with any profile. The etch process also removes the interfacial dielectric layer 106 from the fins 102 where the dummy gate stack 112 and gate spacer 220 do not mask the etch process.

The source/drain regions 221 can then be epitaxially grown in the recesses. The epitaxial growth process may in-situ dope the epitaxy source/drain regions 221 with a p-type dopant for forming a p-type device or an n-type dopant for forming an n-type device, and/or by implantation after the epitaxial growth. In some examples, the epitaxy source/drain regions 221 can include silicon, SiC, SiP, SiCP, a II-VI compound semiconductor, a III-V compound semiconductor, or the like, wherein the epitaxy source/drain regions 221 are in situ doped and/or subsequently implanted with, e.g., n-type or p-type dopants. The epitaxial growth may be by any appropriate epitaxy process.

Subsequently, a first interlayer dielectric (ILD) 218 is formed over the substrate 100 and on the gate spacer 220. In some embodiments, the device structure 101 may further include a contact etch stop layer (not shown) underneath the first ILD 218 and above the substrate 100 and gate spacer 220. The first ILD 218 may include materials such as tetraethylorthosilicate (TEOS) oxide, un-doped silicate glass, doped silicon oxide such as borophosphosilicate glass (BPSG), fused silica glass (FSG), phosphosilicate glass (PSG), boron doped silicon glass (BSG), and/or other suitable dielectric materials. The first ILD 218 may be deposited by a suitable deposition technique. After the first ILD 218 is deposited, a chemical mechanical planarization (CMP) process is performed to planarize the first ILD 218, defining a top surface 224 of the first ILD 218 that is substantially coplanar with a top surface 222 of the dummy gate layer 108, which is exposed for subsequent fabrication stages, as shown in FIG. 2A. The CMP process can remove the hardmask layer 110.

Although not shown in FIG. 2A but illustrated in FIG. 2B, the gate spacer 220 is also formed on the sidewalls of the dummy gate stack 112 that intersect line A-A', and hence, the gate spacer 220 may laterally encompass the dummy gate stack 112. The first ILD 218 is also formed on the gate spacer 220 along the cross section of line A-A', as shown in FIG. 2B. These features are not depicted in FIG. 2A so as to not obscure or occlude other features shown therein; however, these features are illustrated in FIG. 2B and subsequent figures corresponding to the cross-section views along lines A-A'. In other examples, these features in the cross-section of line A-A' may be different or may be omitted. For example, the gate spacer 220 and first ILD 218 may be formed as described when the dummy gate stack 112 is initially patterned with sidewalls that intersect the line A-A'. In other examples, a gate structure may be "cut" after forming the first ILD 218 and/or after replacing the dummy gate stack 112, and another dielectric structure may be formed where the gate structure is cut. In these examples the gate spacer 220 may be separate, respective gate spacers on sidewalls of the gate structure proximate the source/drain regions 221, and a gate-cut dielectric structure may be in the place of the gate spacer 220 and first ILD 218 abutting the dummy gate layer 108 in FIG. 2B and subsequent corresponding cross-section views.

Figure 3A:
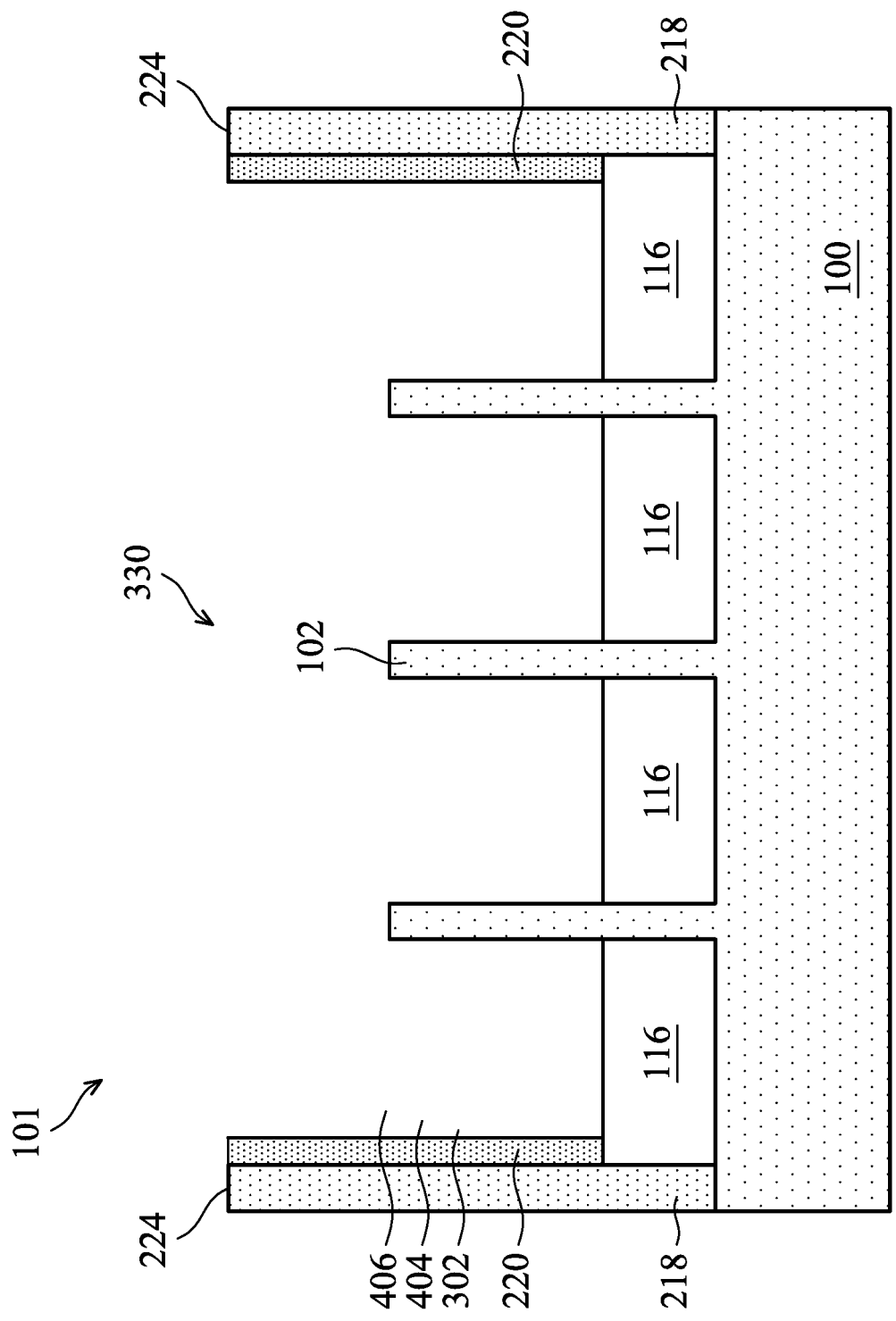
FIGS. 3A, 3B, 4A, 4B, 5A, 5B, 8A, 8B, 8C, 9A, 9B, 9C, 11A, 11B, 11C, 12A, 12B, 12C, 13A, 13B, 13C, 14A, 14B, 14C, and 15A, 15B, 15C depict cross-sectional views of the semiconductor device structure at different manufacturing stages in accordance with some embodiments.
Figure 3B:
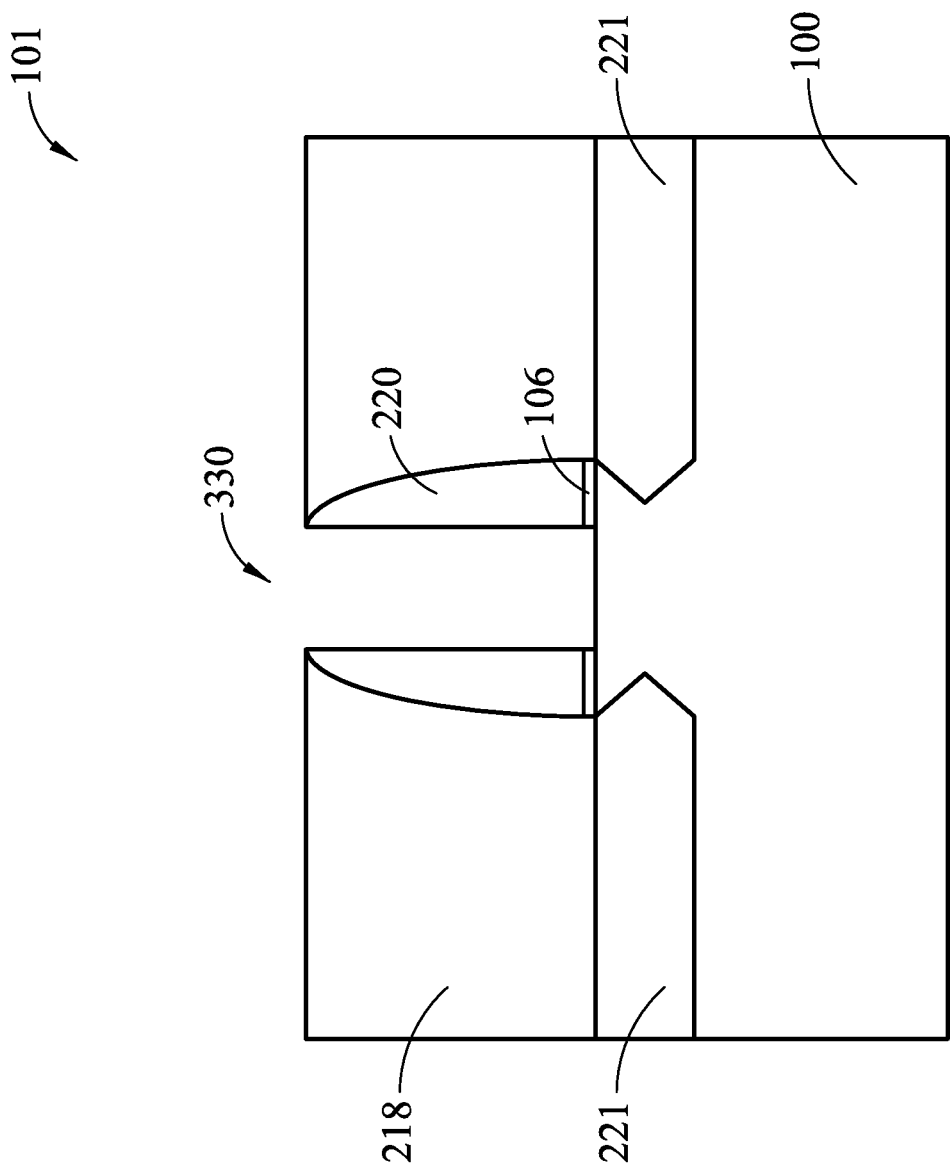

In FIGS. 3A and 3B, the dummy gate layer 108 is removed, and the interfacial dielectric layer 106 exposed by the removal of the dummy gate layer 108 is also removed. The removal of the dummy gate layer 108 and corresponding interfacial dielectric layer 106 defines an opening 330 in the gate spacer 220 in the first ILD 218. The opening 330 allows a replacement gate structure to be formed therein. The dummy gate layer 108 and interfacial dielectric layer 106 may be removed using etch processes. The etch processes may include a suitable wet etch, dry (plasma) etch, and/or other processes. For example, a dry etch process may use chlorine-containing gases, fluorine-containing gases, other etching gases, or a combination thereof. The wet etching solutions may include NH$_4$OH, HF (hydrofluoric acid) or diluted HF, deionized water (DIW), TMAH (tetramethylammonium hydroxide), other suitable wet etching solutions, or combinations thereof. As illustrated in FIG. 3B, the interfacial dielectric layer 106 remains disposed between the gate spacer 220 and the fin 102 after the removal of the dummy gate layer 108 and the corresponding underlying portion of the interfacial dielectric layer 106.

Although not shown, an interfacial dielectric layer may be formed along surfaces of the fin 102 exposed by the opening 330. In an example, the interfacial dielectric layer may include a dielectric material such as silicon oxide layer (SiO$_2$), SiON, SiOCN, SiCN, and the like. The interfacial dielectric layer may be formed by chemical oxidation, thermal oxidation, atomic layer deposition (ALD), CVD, and/or other suitable deposition technique. The interfacial dielectric layer can be formed between the fin 102 and a gate dielectric layer that is subsequently formed, and may be formed along sidewalls of the openings 330 in contact with and between the gate spacer 220, for example. In some examples, the interfacial dielectric layer 106 underlying the dummy gate layer 108 is not removed, and the interfacial dielectric layer 106 can form this interfacial dielectric layer for the replacement gate structure.

Figure 4A:
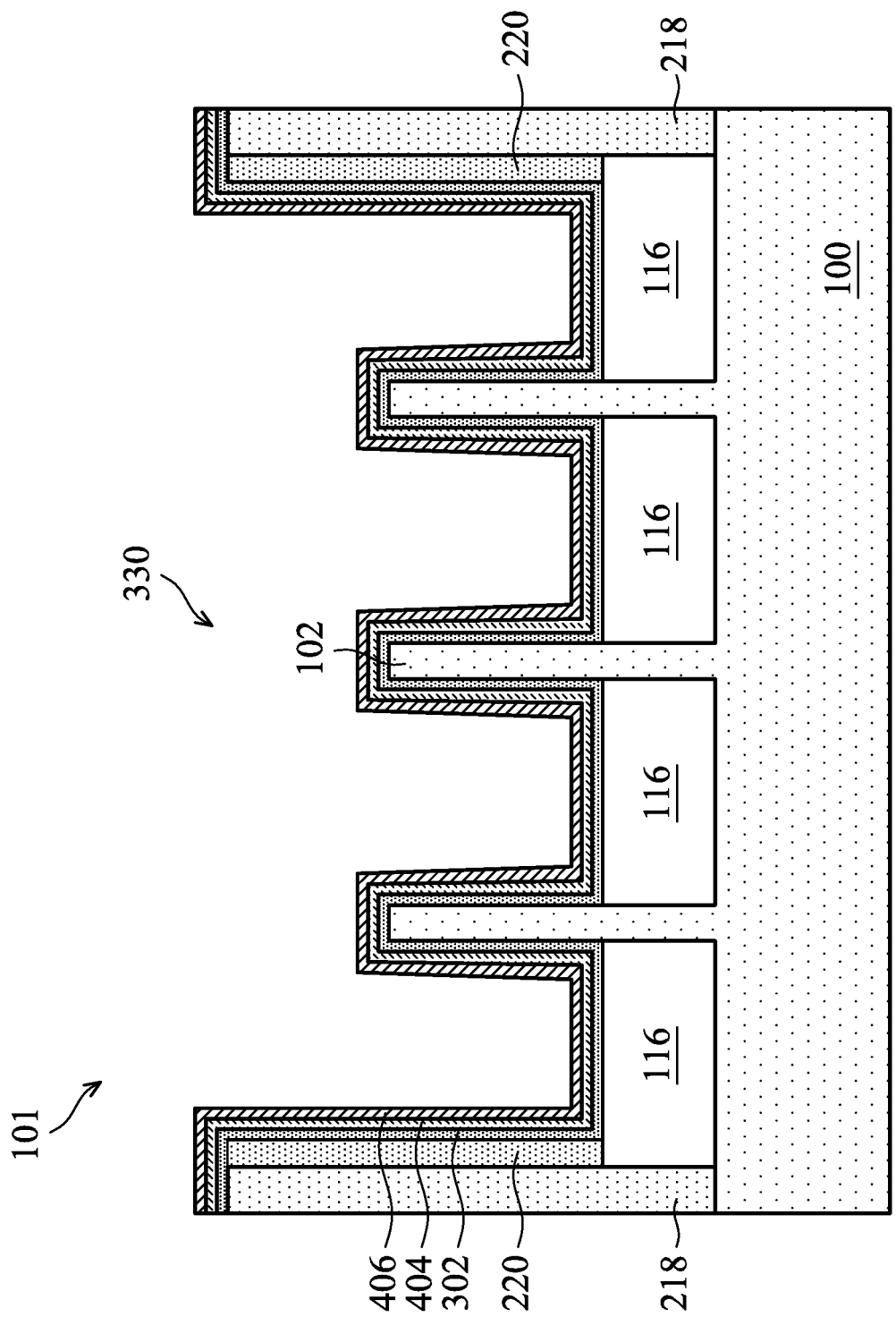
Figure 4B:
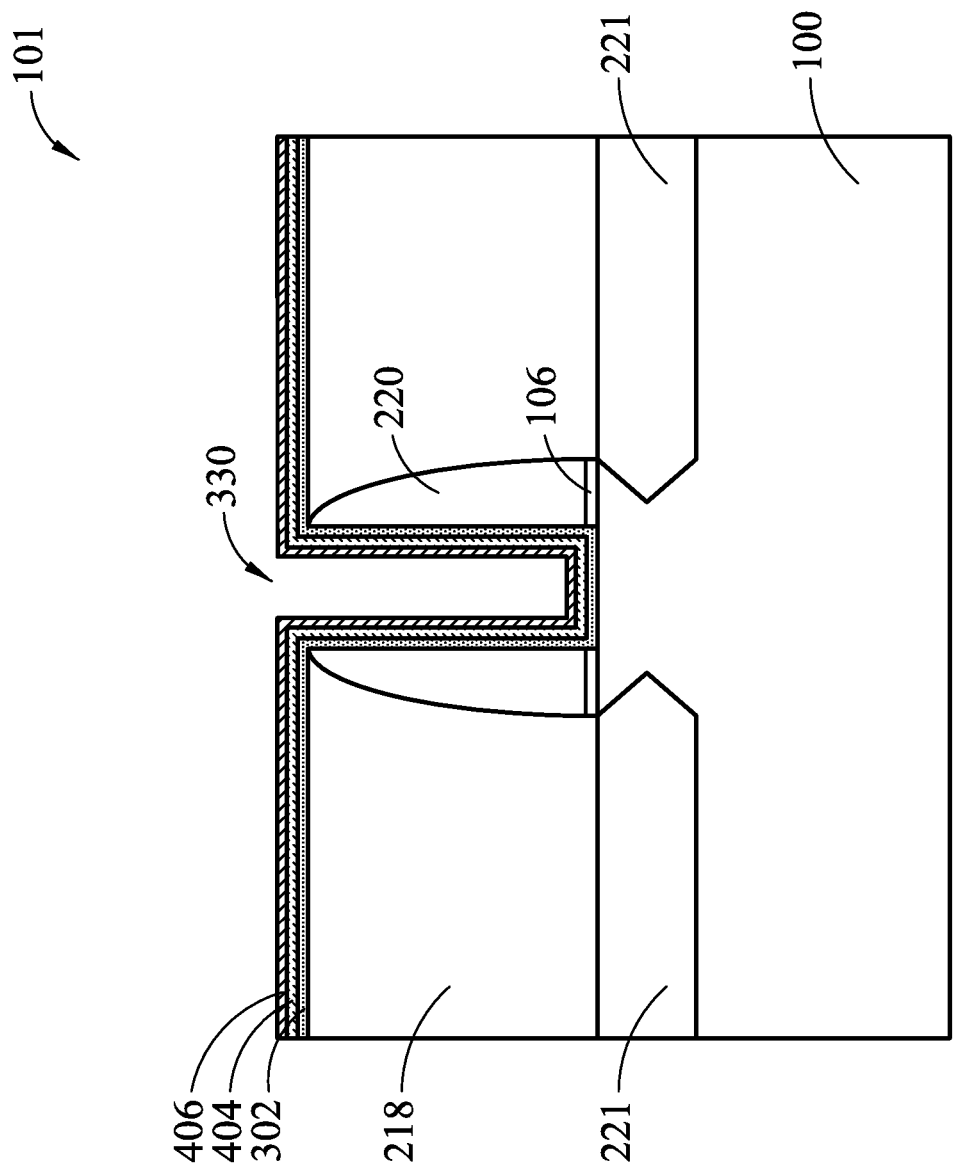

In FIGS. 4A and 4B, a gate dielectric layer 302 is conformally deposited in the opening 330 over the fins 102, isolation structures 116, and sidewalls of the gate spacer 220. The gate dielectric layer 302 includes a high-k dielectric constant material, such as HfO$_2$, Al$_2$O$_3$, LaO$_2$, TiO$_2$, HfZrO, Ta$_2$O$_3$, HfSiO$_4$, ZrO$_2$, ZrSiO$_2$, other suitable material, or a combination thereof. The gate dielectric layer 302 may be formed by atomic layer deposition (ALD), plasma enhanced chemical vapor deposition (PECVD), molecular beam deposition (MBD), and/or other deposition techniques.

Aspects of the present disclosure provide a wet process approach for forming an etch protection mechanism for features during removal of a silicon cap on a high-k gate dielectric layer. The etch protection mechanism formed by the wet process may reduce damage to the semiconductor device structure 101, which may provide improved electric behavior and lower electric leakage.

In FIGS. 4A and 4B, a first capping layer 404 is conformally formed on the gate dielectric layer 302. The first capping layer 404 can include a titanium alloy material such as TiN, TiSiN, and/or containing a Si or C doping elements. In some examples, the first capping layer 404 is deposited by ALD, PECVD, MBD, or other deposition techniques. A first thermal process may be performed to anneal the first capping layer 404 and gate dielectric layer 302. The first thermal process can improve the quality of the gate dielectric layer 302, for example. The first thermal process can, for example, de-gas hydrogen that may be formed in the first capping layer 404, densify the first capping layer 404, cause reactions in the first capping layer 404 to remove dangling bonds, and/or crystallize the first capping layer 404. The first thermal process may include a rapid thermal anneal (RTA), a furnace anneal, or the like. The first thermal process may be performed at temperature in a range from about 800° C. to about 950° C. The first thermal process may be performed for a duration in a range from about 5 seconds to about 10 seconds. The first thermal process may be performed in an ammonia gas environment at a flow rate in a range from about 5 sccm to about 50 sccm. The first capping layer 404 may be a protection layer for the gate dielectric layer 302.

Further, in FIGS. 4A and 4B, a second capping layer 406 is conformally formed on the first capping layer 404. The second capping layer 406 may be or include silicon (e.g., amorphous silicon). In some examples, the second capping layer 406 is deposited by ALD, PECVD, MBD, or other deposition techniques. The second capping layer 406 can have a thickness in a range from about 10 to about 60 angstroms. A second thermal process may be performed to anneal the second capping layer 406. The second thermal process may further improve the quality of the gate dielectric layer 302 and/or reduce equivalent oxide thickness (EOT) of the gate dielectric layer 302. The second thermal process can, for example, absorb oxygen from the first capping layer 404, gate dielectric layer 302, and/or interfacial dielectric layer, which can reduce an equivalent oxide thickness (EOT) of the replacement gate structure. The second thermal process may include a rapid thermal anneal (RTA), a furnace anneal, or the like. The second thermal process may be performed at temperature in a range from about 800° C. to about 950° C. The second thermal process may be performed for a duration in a range from about 5 seconds to about 10 seconds.

Figure 5A:
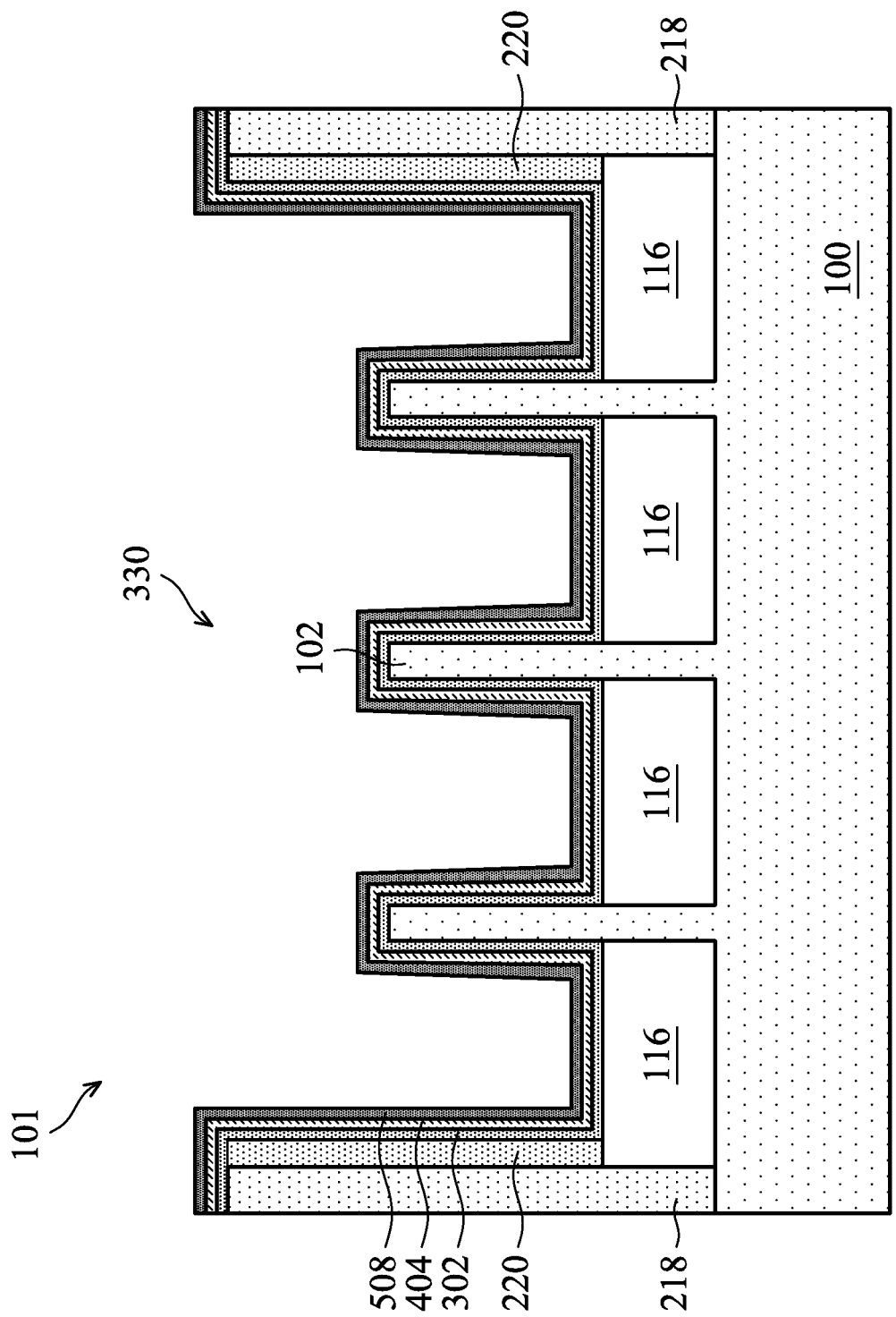
Figure 5B:
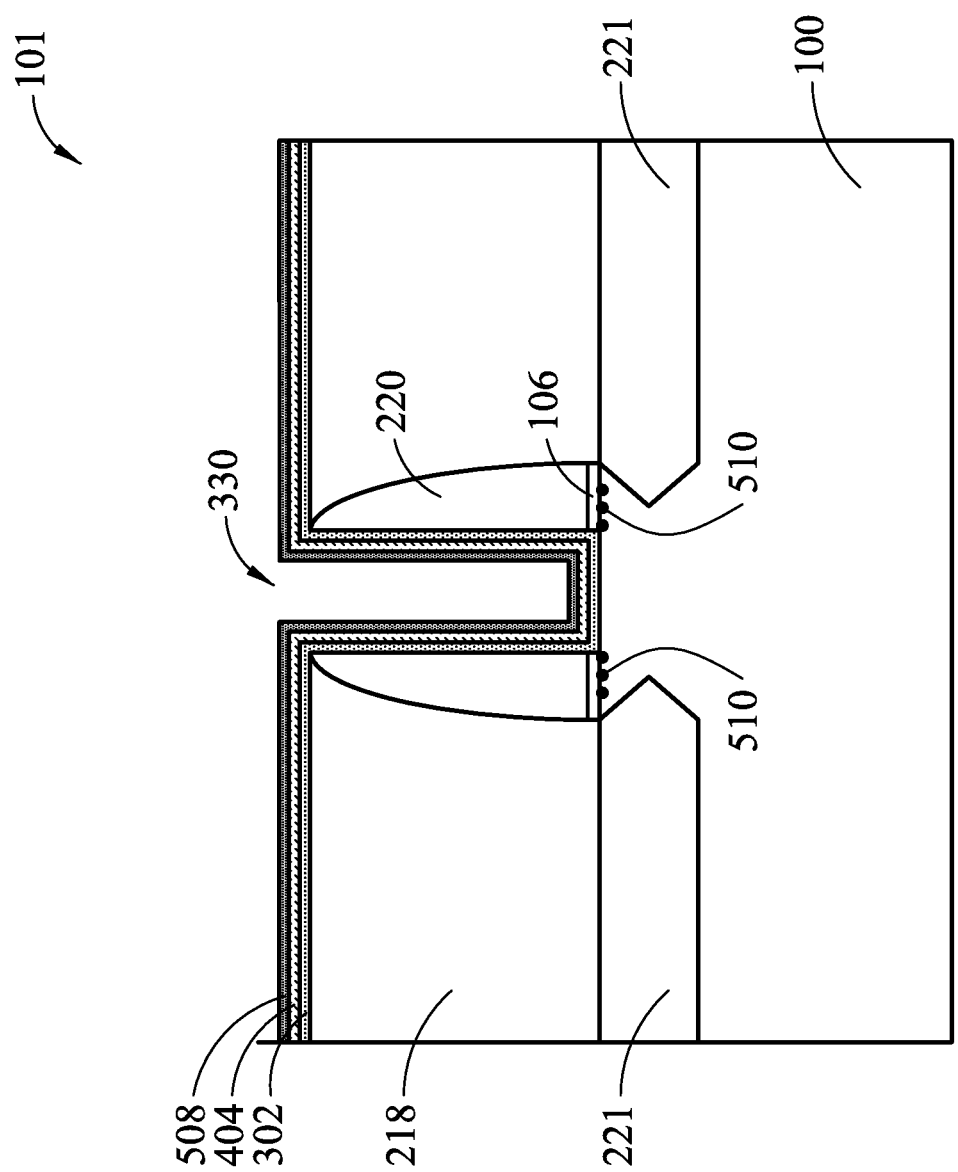

In FIGS. 5A and 5B, after the second thermal process, the second capping layer 406 is removed using a wet etch process that results in formation of a first self-assembled monolayer (SAM) 508 and of a second SAM 510 that serves as an etch protection layer. The wet etch process uses a solution containing an etchant, a boric acid chelating ligand, and a phosphoric acid chelating ligand diluted in DIW. In some examples, the etchant is or includes ammonium hydroxide ($NH_4OH$), tetramethylammonium hydroxide (TMAH), or the like. For example, the solution can contain ammonium hydroxide ($NH_4OH$) at a concentration in a range from about 1 wt % to about 6 wt %, or can contain tetramethylammonium hydroxide (TMAH) at a concentration in a range from about 1 wt % to about 2.3 wt %. In some examples, the solution includes ammonium phosphate for the phosphoric acid chelating ligand, and includes ammonium borate buffer for the boric acid chelating ligand. The solution can contain ammonium phosphate at a concentration in a range from about 0.5 wt % to about 5 wt %, and can contain ammonium borate buffer at a concentration less than or equal to about 1 wt %. The wet etch process can be performed by immersing and/or rinsing the device structure 101 in the solution. The wet etch process may be performed at a temperature in a range from about room temperature (e.g., 23° C.) to about 80° C. The wet etch process may be performed for a duration in a range from about 30 seconds to 90 about seconds.

Figure 6:
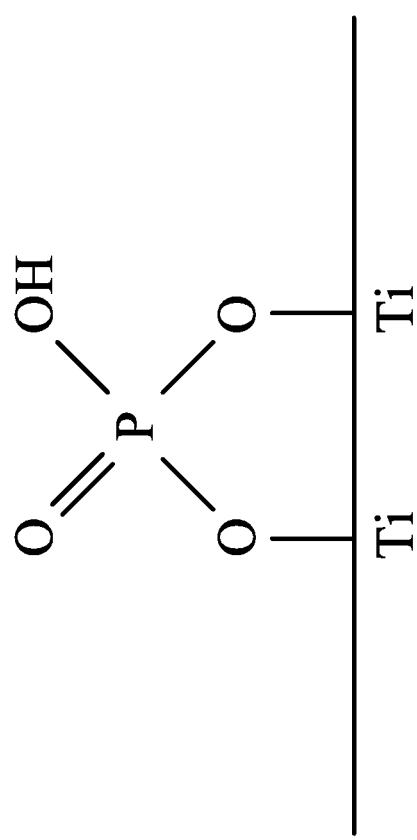
FIGS. 6, 7, and 10 depict different examples of surface structure reactions during the manufacturing stages in accordance with some embodiments.

The wet etch process results in removal of the second capping layer 406 and formation of the first SAM 508 on the first capping layer 404. The first SAM 508 may include a phosphate ligand from the wet etch process reacted with titanium at the surface of the first capping layer 404 as shown in FIG. 6. The titanium in the first capping layer 404 and the phosphate ligand in the wet etch solution forms mono-dentate and bi-dentate complexes that form the first SAM 508. The first SAM 508 can act as an adhesion layer between the first capping layer 404 and a subsequently formed layer.

Figure 7:
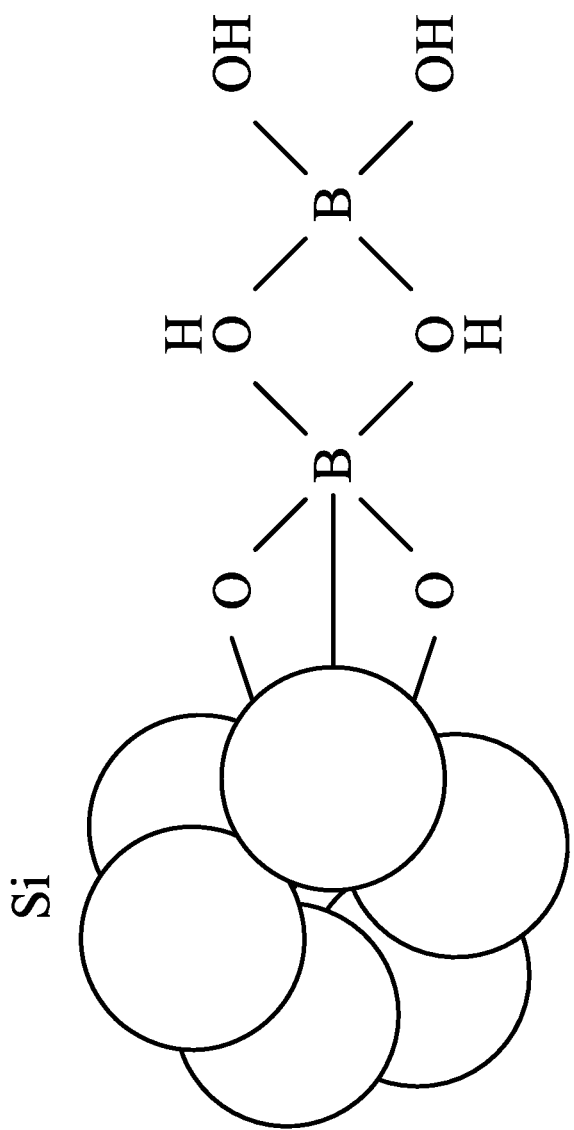

A weak point may be present in and/or between the various layers formed during the replacement gate process and other components of the semiconductor device structure 101. For example, a leakage point may be through the first capping layer 404, gate dielectric layer 302, and the interfacial dielectric layer (if present) to the gate spacer 220, fin 102, interfacial dielectric layer 106, and/or isolation structure 116. As shown in FIG. 5B, the wet etch process also forms a second SAM 510 that serves as an etch protection layer that protects at the leak points, for example, during subsequent processing. For example, the second SAM 510 is formed by the borate ligand used in the wet etch process that reacts with silicon oxide (e.g., $SiO_2$) of the interfacial dielectric layer 106 and/or gate spacer 220, and as shown in FIG. 7. The silicon oxide reacts with the boric acid ligand from the solution of the wet etch process to form silicon-boronate complex agents that form the second SAM 510. During the wet etch process, the boric acid chelating ligand penetrates any weak spot through the first capping layer 404, gate dielectric layer 302, and the interfacial dielectric layer to react with the silicon oxide of the interfacial dielectric layer 106 to form the second SAM 510, such as at the interface of between the interfacial dielectric layer 106 and the isolation structures 116, the interface between the interfacial dielectric layer 106 and the fin 102, and/or other locations.

Although the solution described herein includes both ammonium phosphate for the phosphoric acid chelating ligand and ammonium borate buffer for the boric acid chelating ligand to form the first SAM 508 and the second SAM 510 by a same wet etch process, the solution can include one of the ammonium phosphate or ammonium borate buffer to form the corresponding one of the first SAM 508 and the second SAM 510. Further, different solutions may be implemented, with each solution including one of the ammonium phosphate or ammonium borate buffer, to sequentially form the first SAM 508 and the second SAM 510. Other chemicals may be implemented instead of and/or in addition to ammonium phosphate or ammonium borate buffer to form a first SAM and a second SAM.

Following the wet etch process, a wet rinse can be performed to remove etching residues from the opening 330. For example, the wet rinse process may use a solution containing pure DIW, deionized carbon dioxide ($DI-CO_2$), and/or diluted $NH_4OH$. The rinse process may be performed at a temperature in a range from about 20° C. to about 80° C.

After the wet rinse, a drying process may also be performed to dry the surfaces of the device structure 101. For example, the drying process may include a spin drying of the substrate 100 in the presence of a flow of nitrogen ($N_2$). The drying process may also or instead include rinsing the surfaces of the device structure 101 with isopropyl alcohol (IPA).

Aspects of the present disclosure provide another wet process for selective patterning of layers, such as a barrier layer and/or work function tuning layers. The wet process may provide for patterning of the layer, such as TaN, without using a layer that is deposited separately as the hardmask for the patterning. The wet process approach may permit removal of, e.g., a barrier layer with a hardmask layer having a reduced thickness and provide an increased Vt tuning window. The wet process approach can allow increased work function tuning layer deposition thickness and also can avoid damage to the work function tuning layer.

Figure 8A:
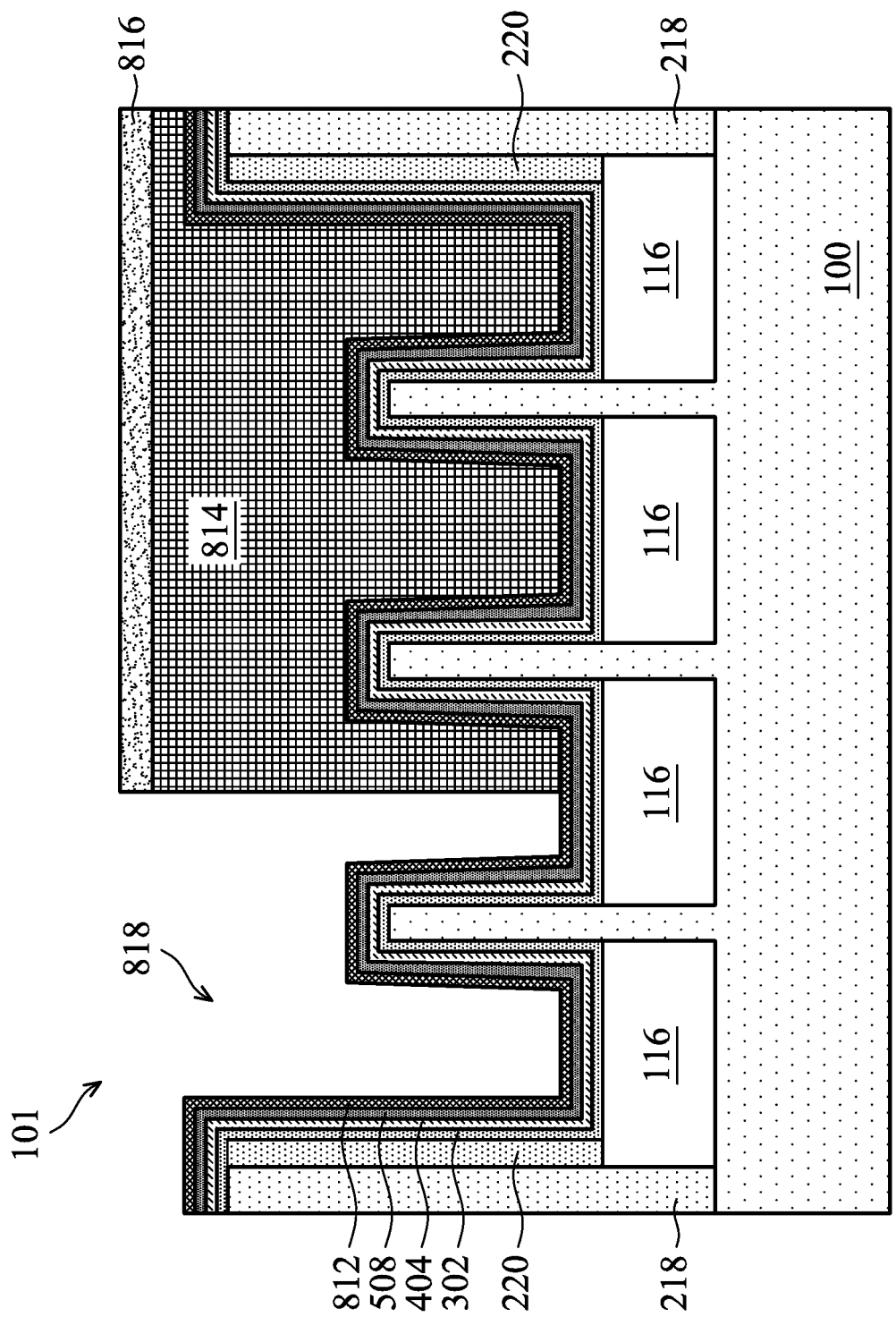
Figure 8B:
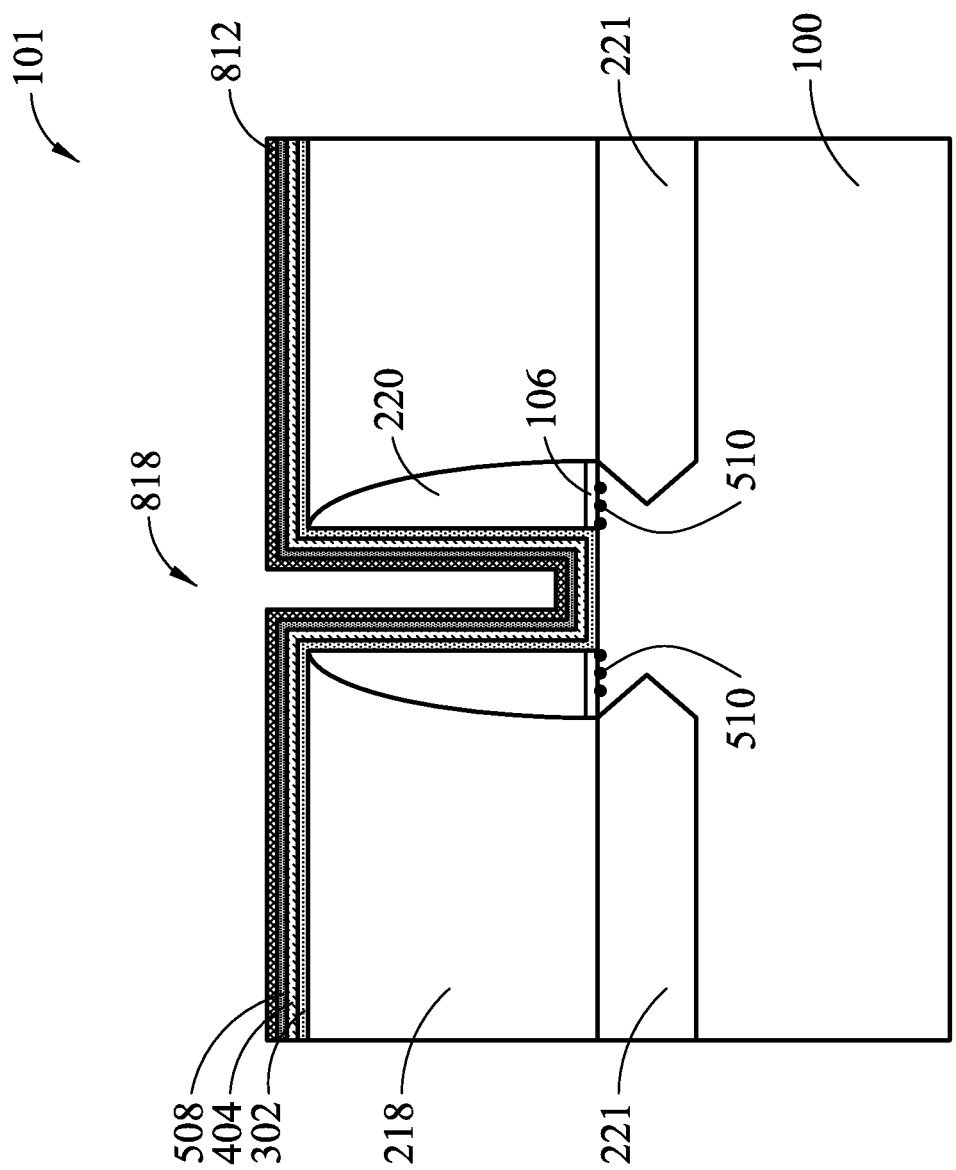
Figure 8C:
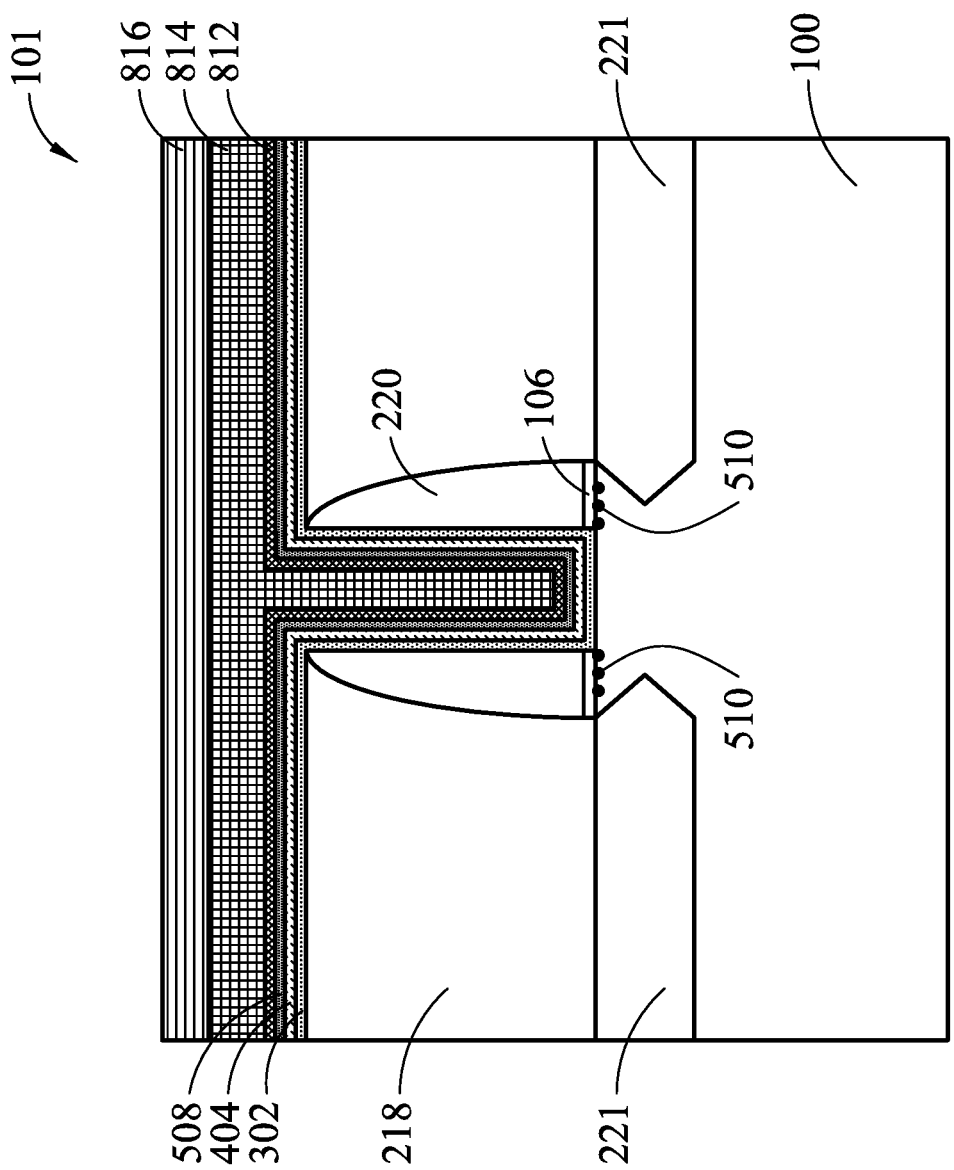

In FIGS. 8A, 8B, and 8C, a barrier layer 812 is conformally formed on the first SAM 508 (or on the first capping layer 404 if the above process is not first performed). The barrier layer 812 can include a nitride, titanium nitride, niobium nitride, silicon nitride, carbon nitride, and/or aluminum nitride of tantalum and/or titanium; or a combination thereof. In some examples, the barrier layer 812 includes TaN or NbN. In some examples, the barrier layer 812 is deposited by ALD, PECVD, MBD, or other deposition techniques.

Further in FIGS. 8A and 8C, after forming the barrier layer 812, a patterned mask structure is disposed on the device structure 101. The patterned mask structure defines a region 818 that is exposed for a wet process. The patterned mask structure covers a portion of the device structure 101, and exposes the region 818 of the device structure 101. The patterned mask structure serves as a mask during the wet process so as to protect the portion of the device structure 101 covered by the patterned mask structure from the wet process.

The patterned mask structure may include a photoresist 816 disposed on a bottom anti-reflective coating (BARC) 814. The photoresist 816 may be patterned by a photolithography process. The BARC 814 may be an organic material coated onto the substrate 100 filling the openings 330 over the barrier layer 812. A portion of the BARC 814 may be removed, such as by a dry etch process after the photoresist 816 is patterned. In the example shown in FIG. 8A, the patterned mask structure protects some fins 102, as shown in FIG. 8C, and does not cover other fins 102, as shown in FIG. 8B. Although the example depicted in FIG. 8A shows the patterned mask structure leaving exposed region 818, it is it is noted that the patterned mask structure may be formed at another portion of the substrate 100 according to a different pattern leaving different portions exposed.

Figure 9A:
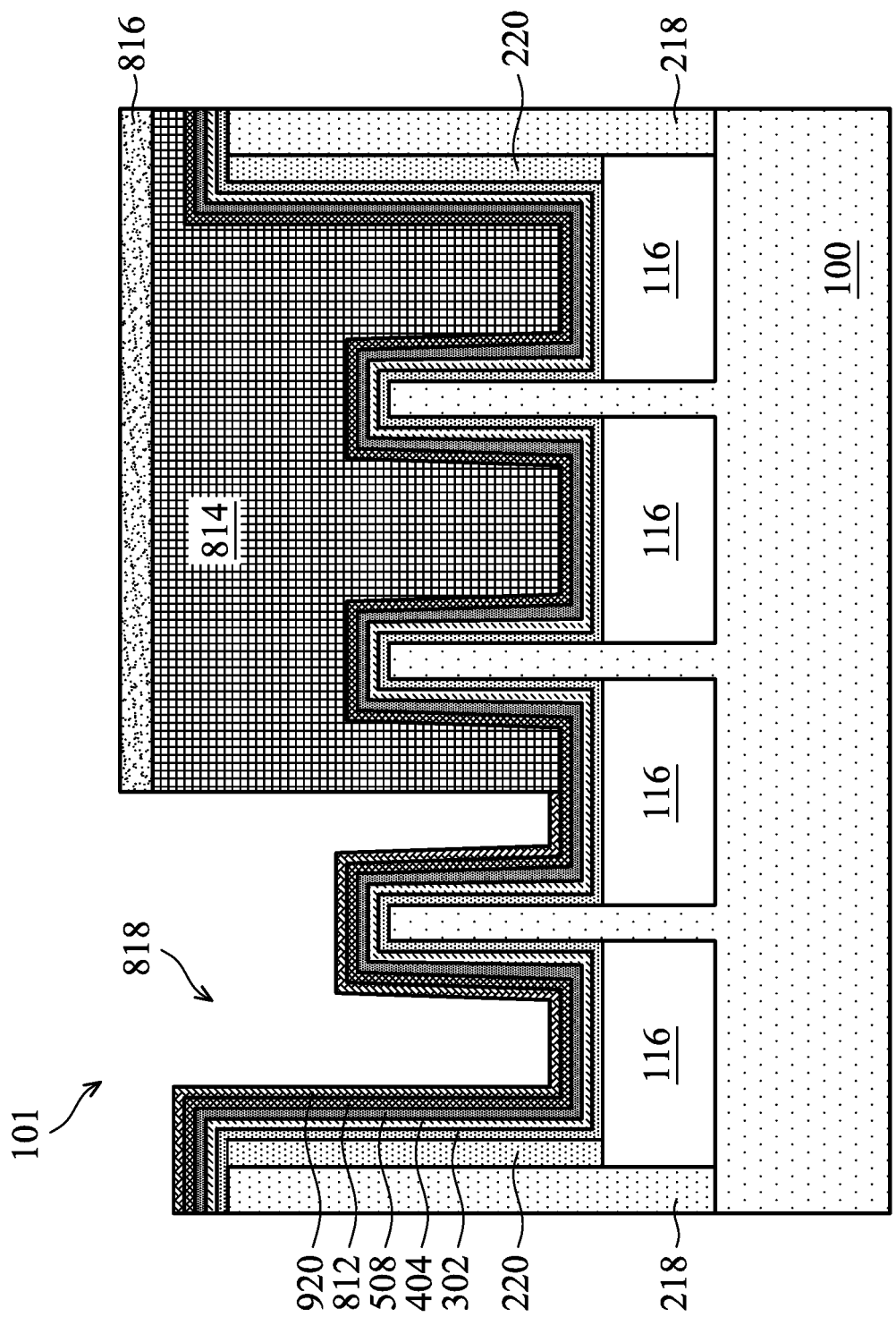
Figure 9B:
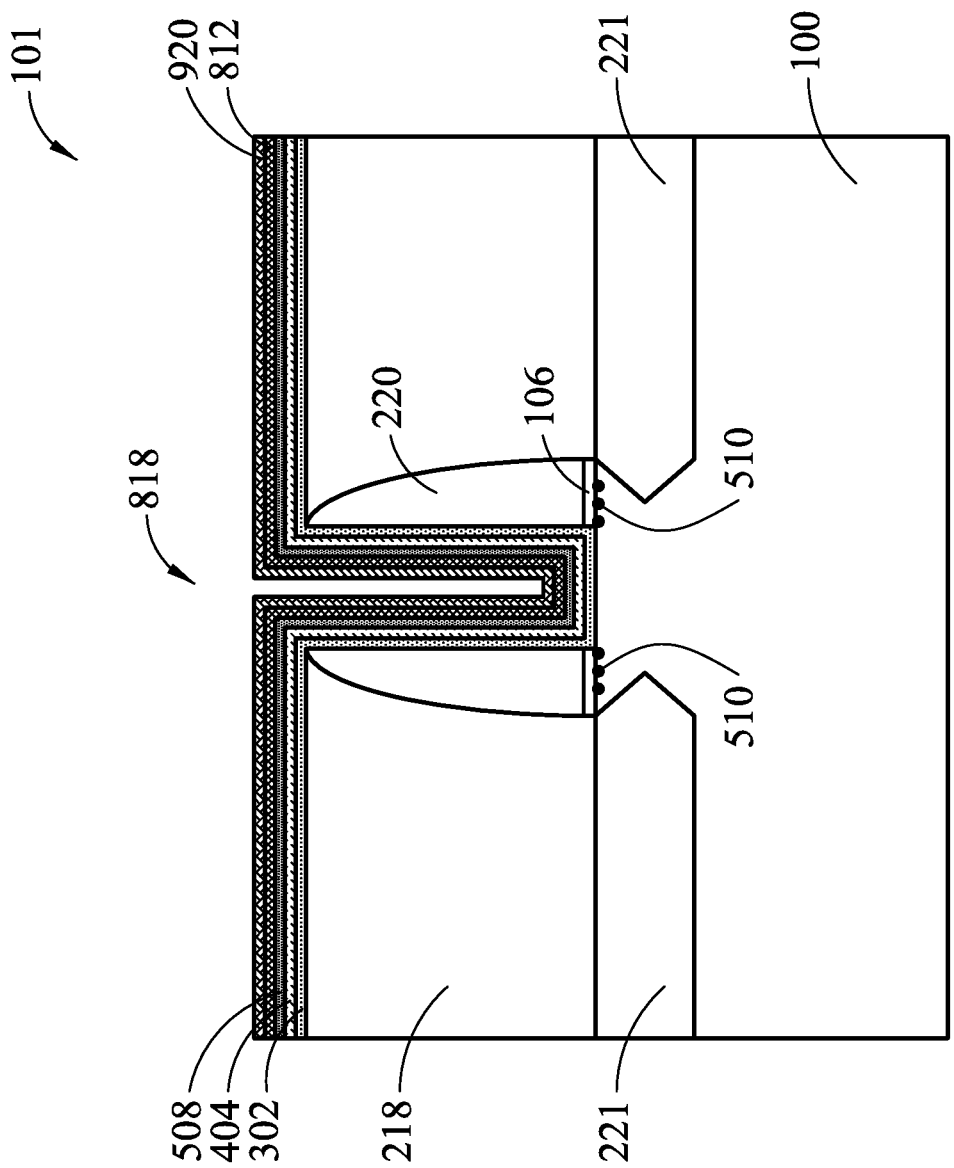
Figure 9C:
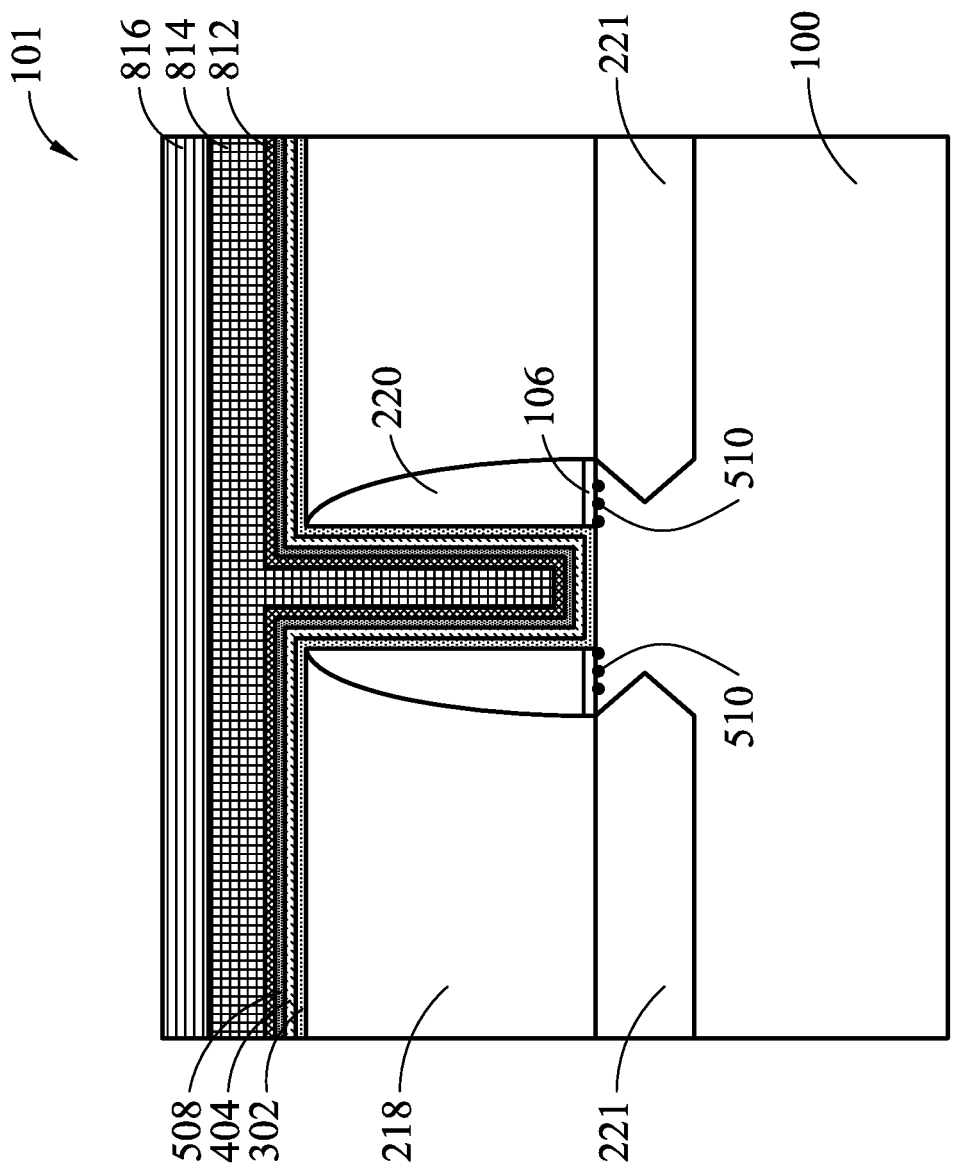

Next, in FIGS. 9A, 9B, and 9C, the wet process can be performed to form a third SAM 920 on the barrier layer 812 in the exposed region 818. The patterned mask structure may protect the covered regions during the wet process, while the barrier layer 812 in the exposed region 818 is modified by the wet process to form the third SAM 920. As shown in FIG. 9C, during the wet process, the covered regions are protected by the patterned mask structure, and the third SAM 920 is not formed in the covered regions.

The wet process can implement a solution comprising hydrogen peroxide ($H_2O_2$) and phosphoric acid ($H_3PO_4$) diluted in DIW. The solution can have a concentration of $H_2O_2$ in a range from about 1 wt % to about 10 wt %, and can have a concentration of $H_3PO_4$ at in a range from about 1 wt % to about 20 wt %. The solution can include other acidic mediums, such as HCl and/or $H_2SO_4$, to achieve a desired pH level. The wet process may be performed in a range from about 20° C. to about 80° C.

Figure 10:
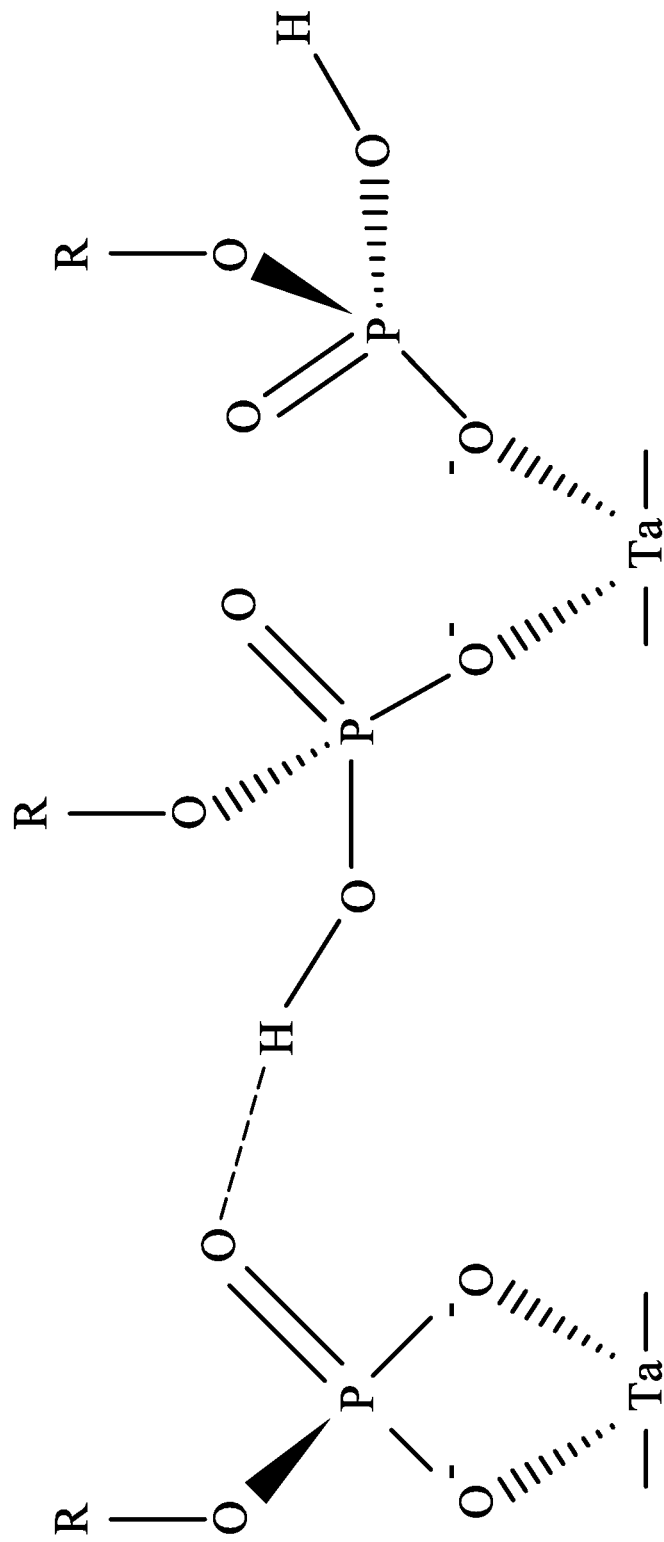

The third SAM 920 is formed by phosphate linkage during the wet process. In some examples, tantalum in the barrier layer 812 reacts with phosphoric acid used in the wet process to form the third SAM 920, as shown in FIG. 10. For use of phosphoric acid, such as in this example, the R group shown in FIG. 10 would be hydrogen (H).

Figure 11A:
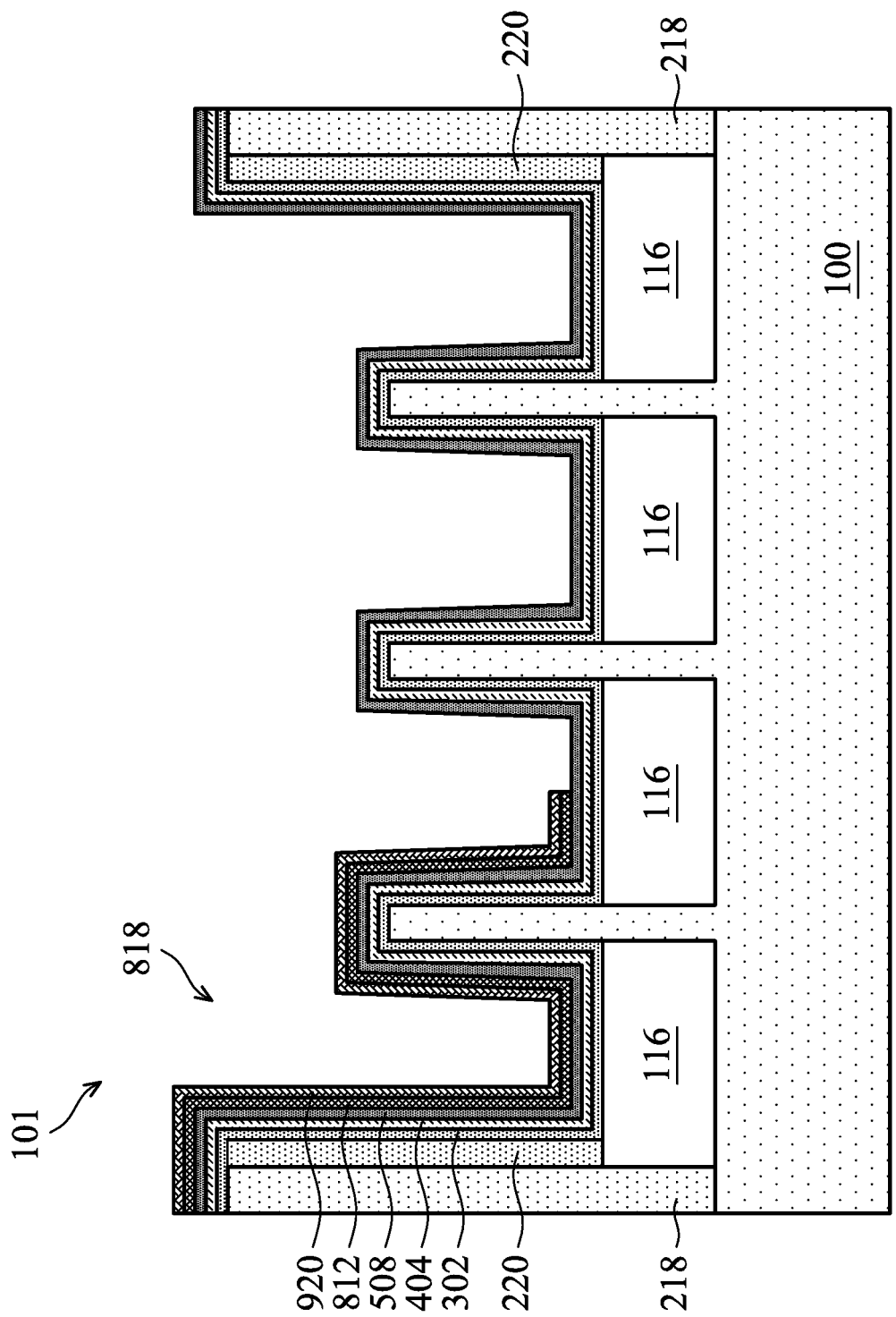
Figure 11B:
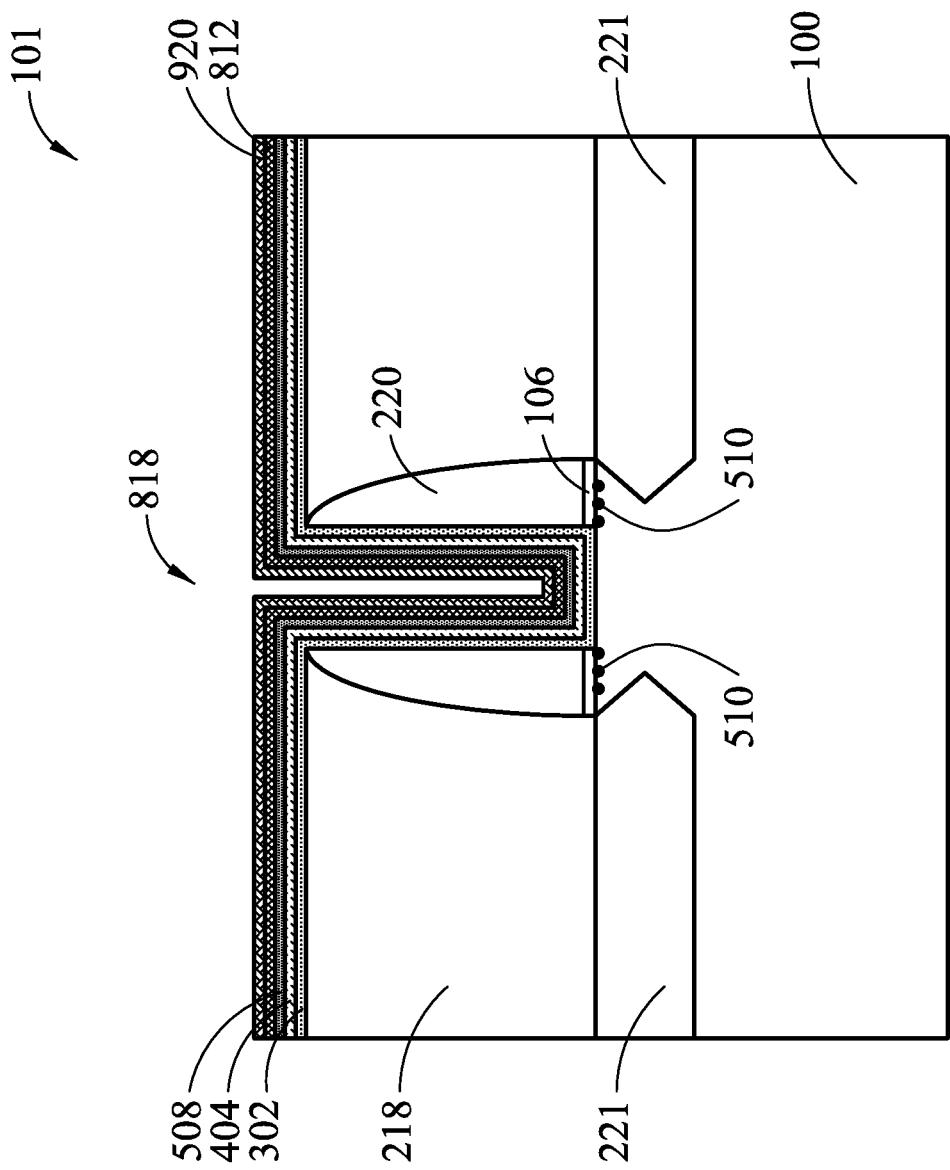
Figure 11C:
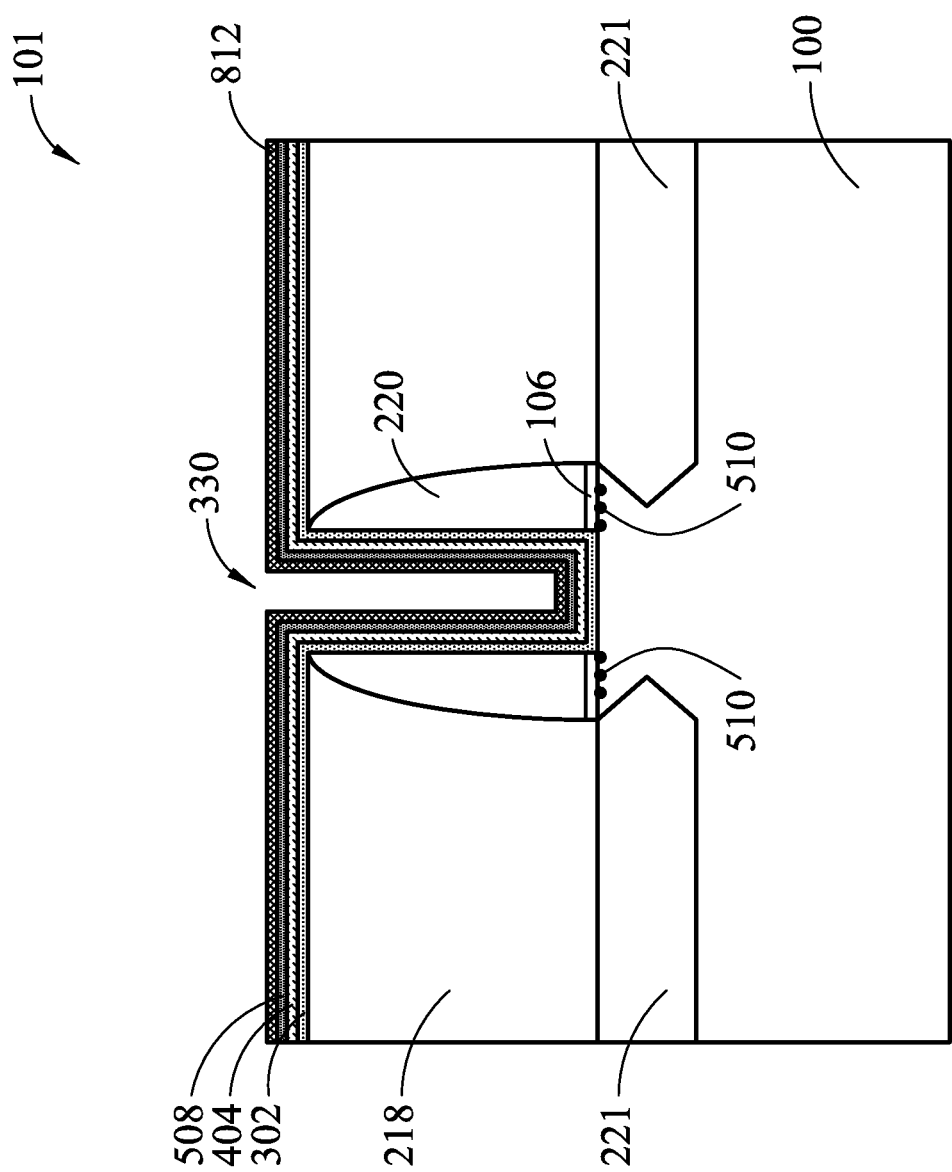

In FIGS. 11A, 11B, and 11C, after forming the third SAM 920, the patterned mask structure can be removed. The BARC 814 and photoresist 816 can be removed, for example, by a plasma ashing process.

Figure 12A:
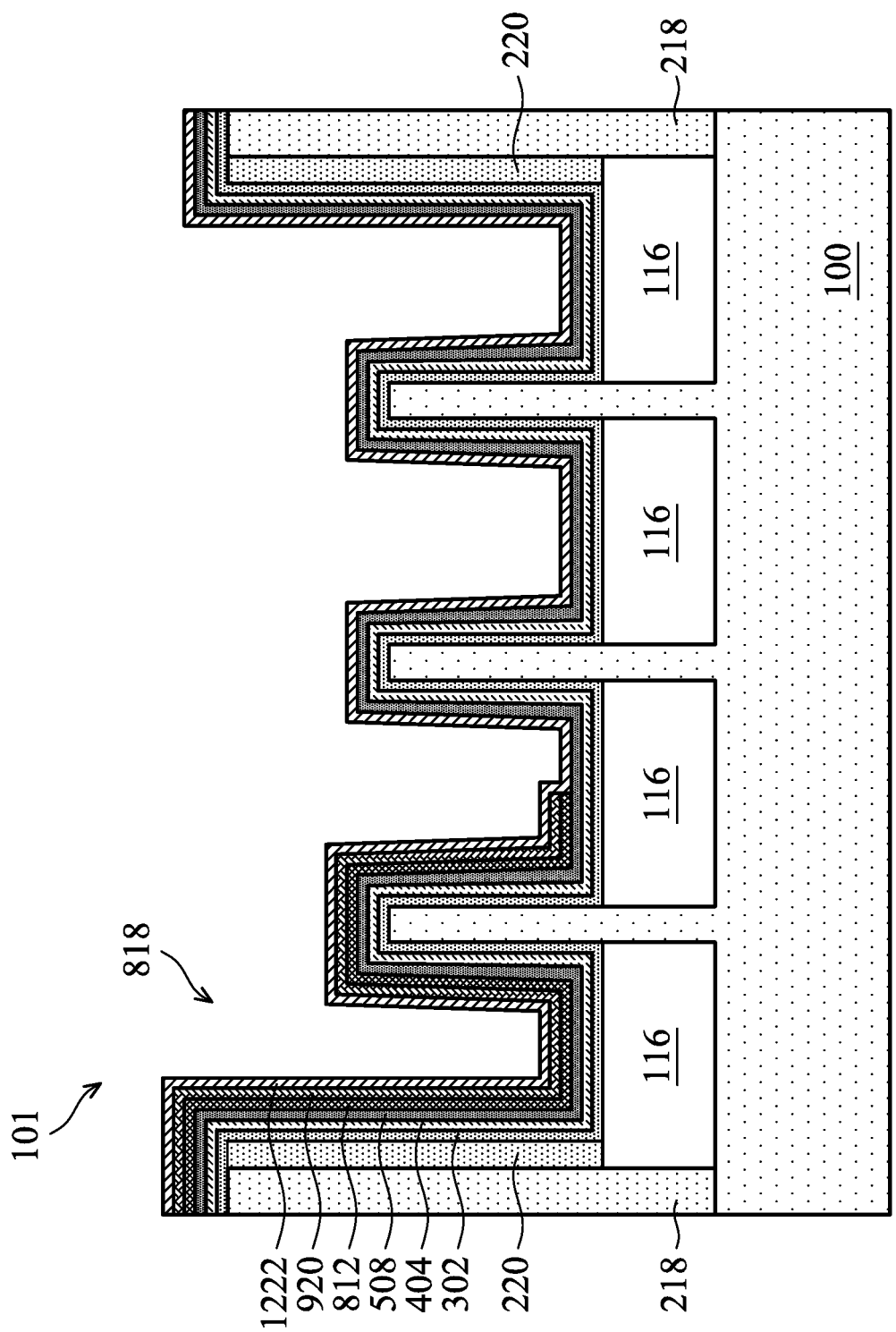
Figure 12B:
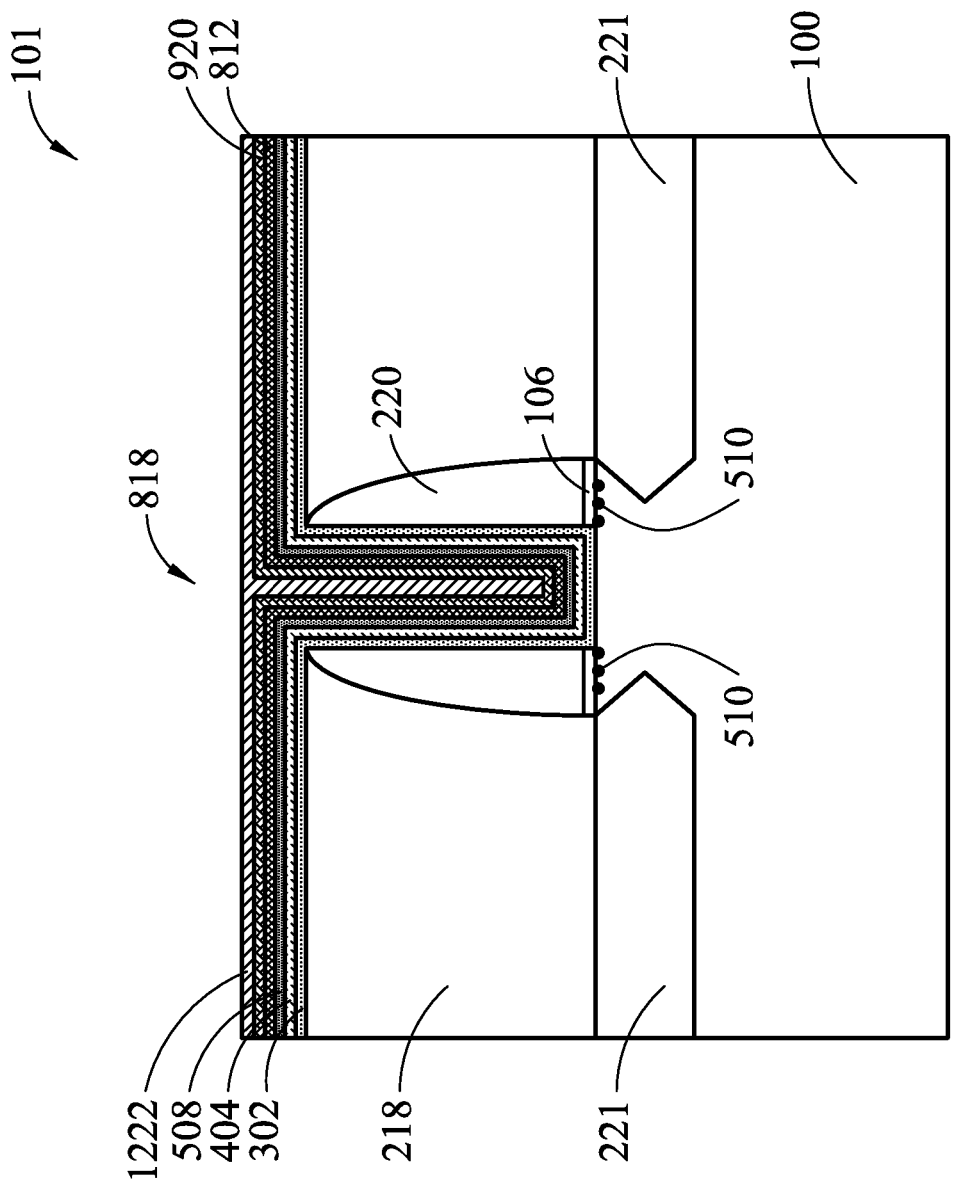
Figure 12C:
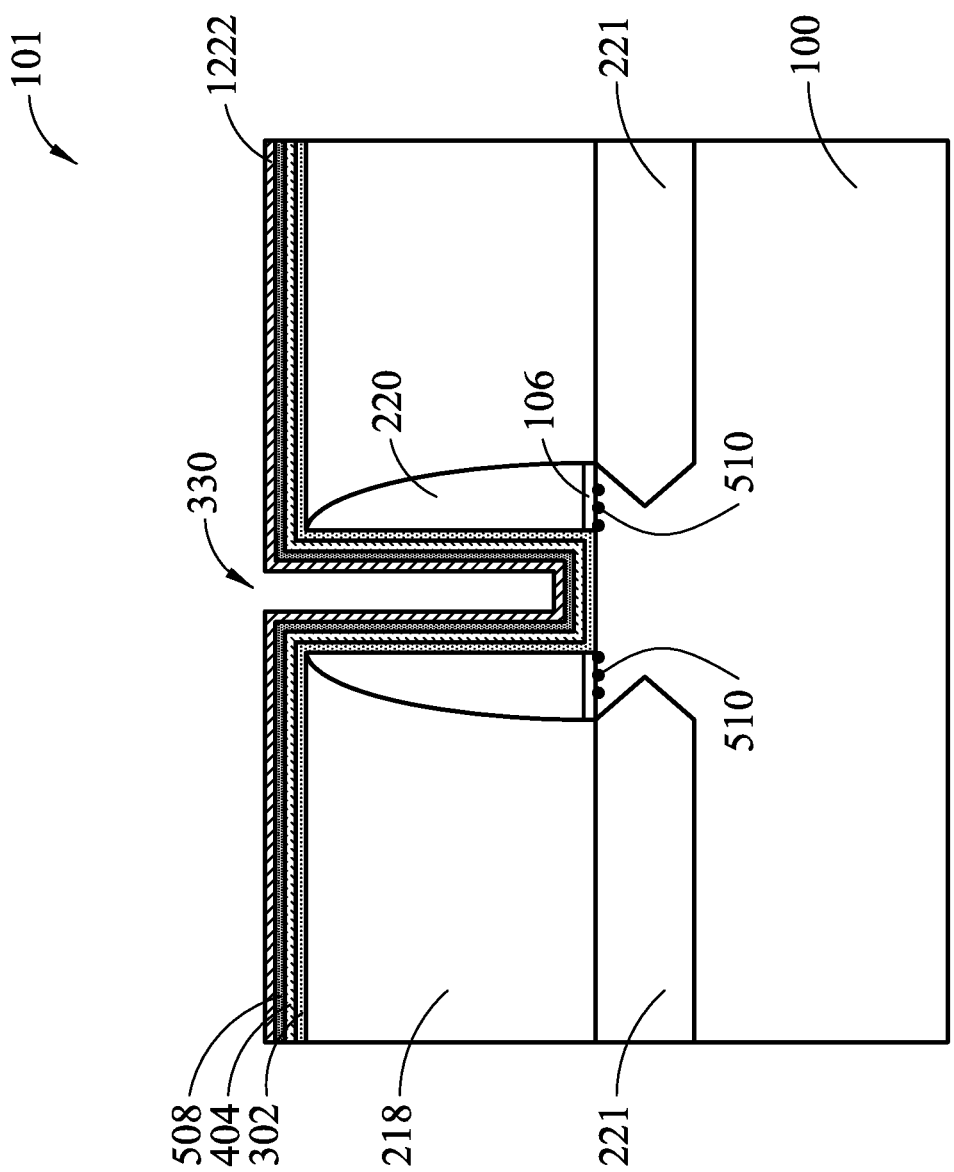

In FIGS. 12A, 12B, and 12C, an etch process is performed to remove the barrier layer 812 from areas outside of the region 818. The third SAM 920 acts as a hardmask layer over the barrier layer 812 in the region 818 during removal of the barrier layer 812 from areas outside of the region 818. The etch process for removal of the barrier layer 812 can use a chloride gas, such as tungsten chloride ($WCl_5$), $NbCl_5$, $MoCl_5$, the like, or a combination thereof.

Figure 13A:
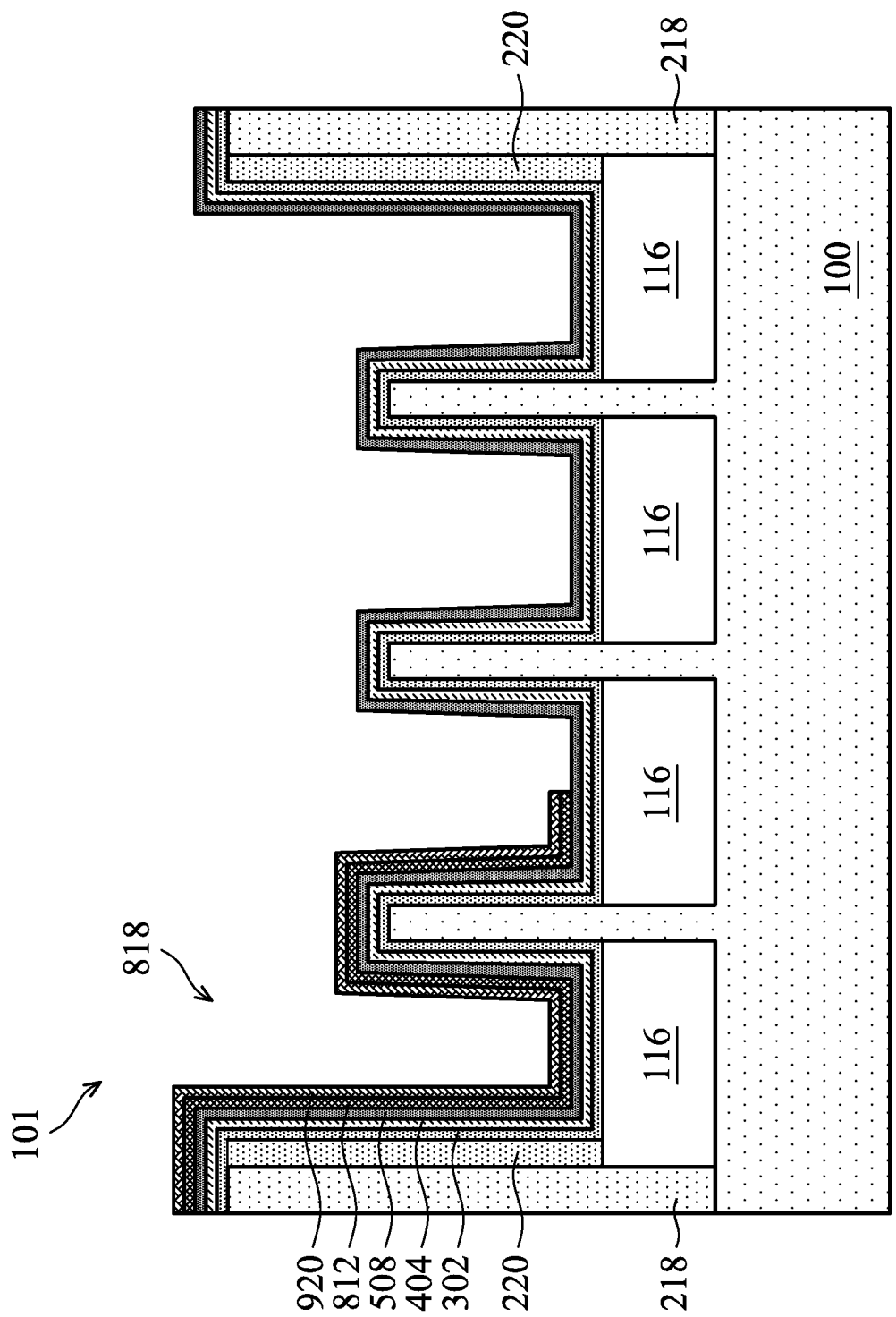
Figure 13B:
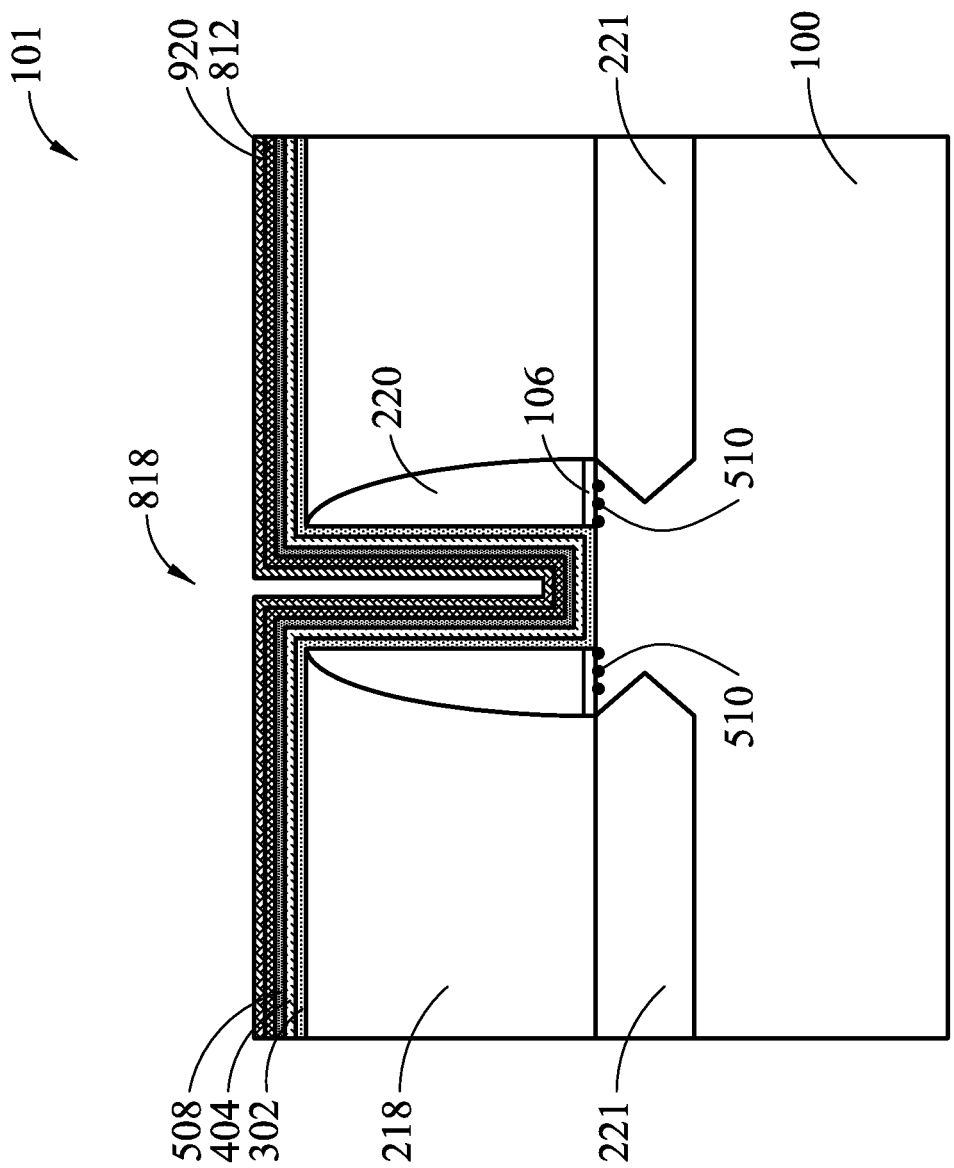
Figure 13C:
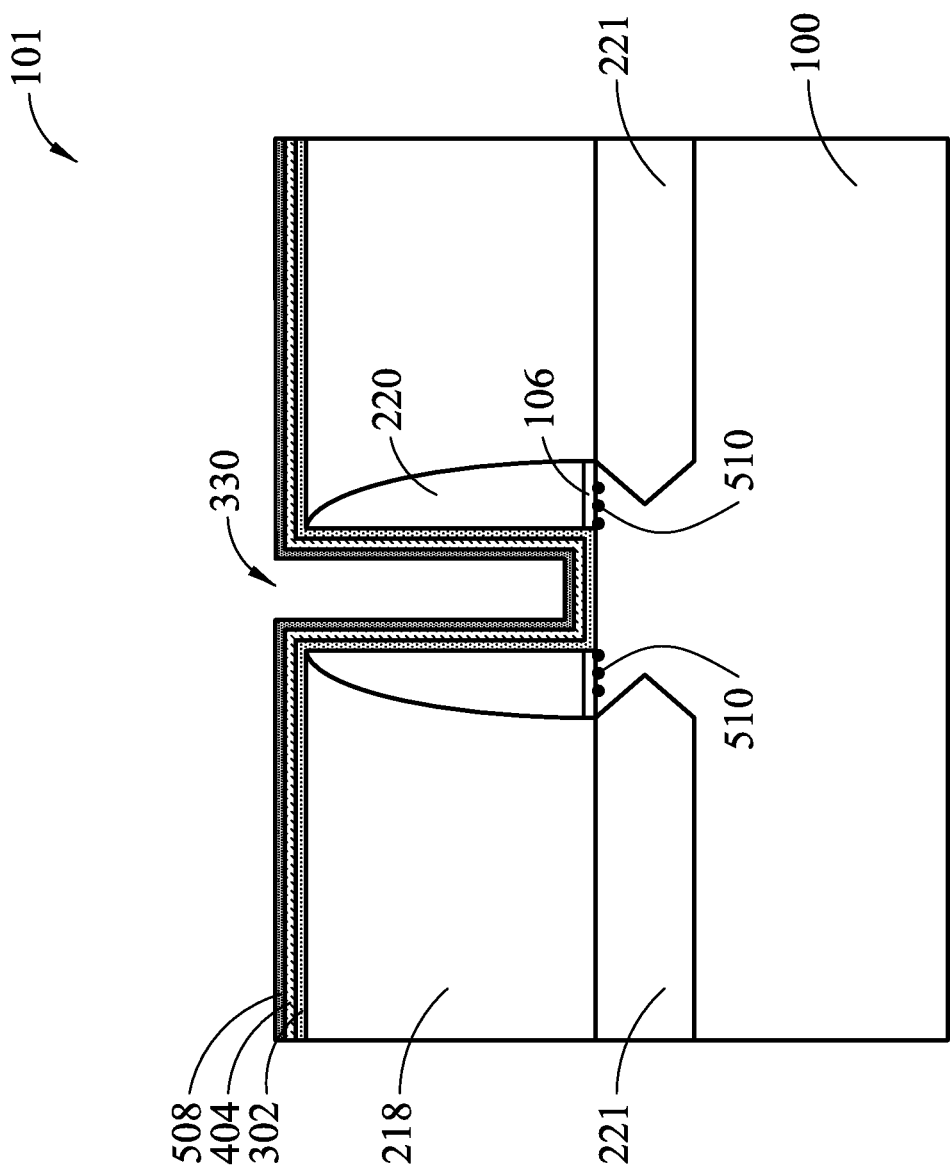

Further in FIGS. 12A, 12B, and 12C, the etch process can result in removal of the barrier layer 812 that is not covered by the third SAM 920 and in the formation of a trace metal layer 1222 on the third SAM 920 in the region 818 and on the first SAM 508 outside of the region 818. The trace metal layer 1222 can include W, Nb, or Mo depending on the chloride gas used in the etch process to remove the barrier layer 812 in the areas not covered by the third SAM 920. The trace metal layer 1222 can be removed, which may increase the threshold voltage (Vt) tuning window, as shown in FIGS. 13A, 13B, and 13C, or can remain in a subsequently completed replacement gate structure for threshold voltage (Vt) tuning.

If removed, the trace metal layer 1222 can be removed by a wet removal process. The wet removal process to remove the trace metal layer 1222 may use DIW with ozone (DIO3), wherein a concentration of the ozone can be in a range from about 1 ppm to about 80 ppm. The wet removal process to remove the trace metal layer 1222 may additionally or alternatively use diluted $NH_4OH$, wherein a mixing ratio of $NH_4OH$ to DIW is in a range from about 1:5 to about 1:50. The wet removal process can be performed at a temperature in a range from about room temperature (e.g., about 23° C.) to about 80° C. A wet rinse and drying process, as described above, can also be performed.

Figure 14A:
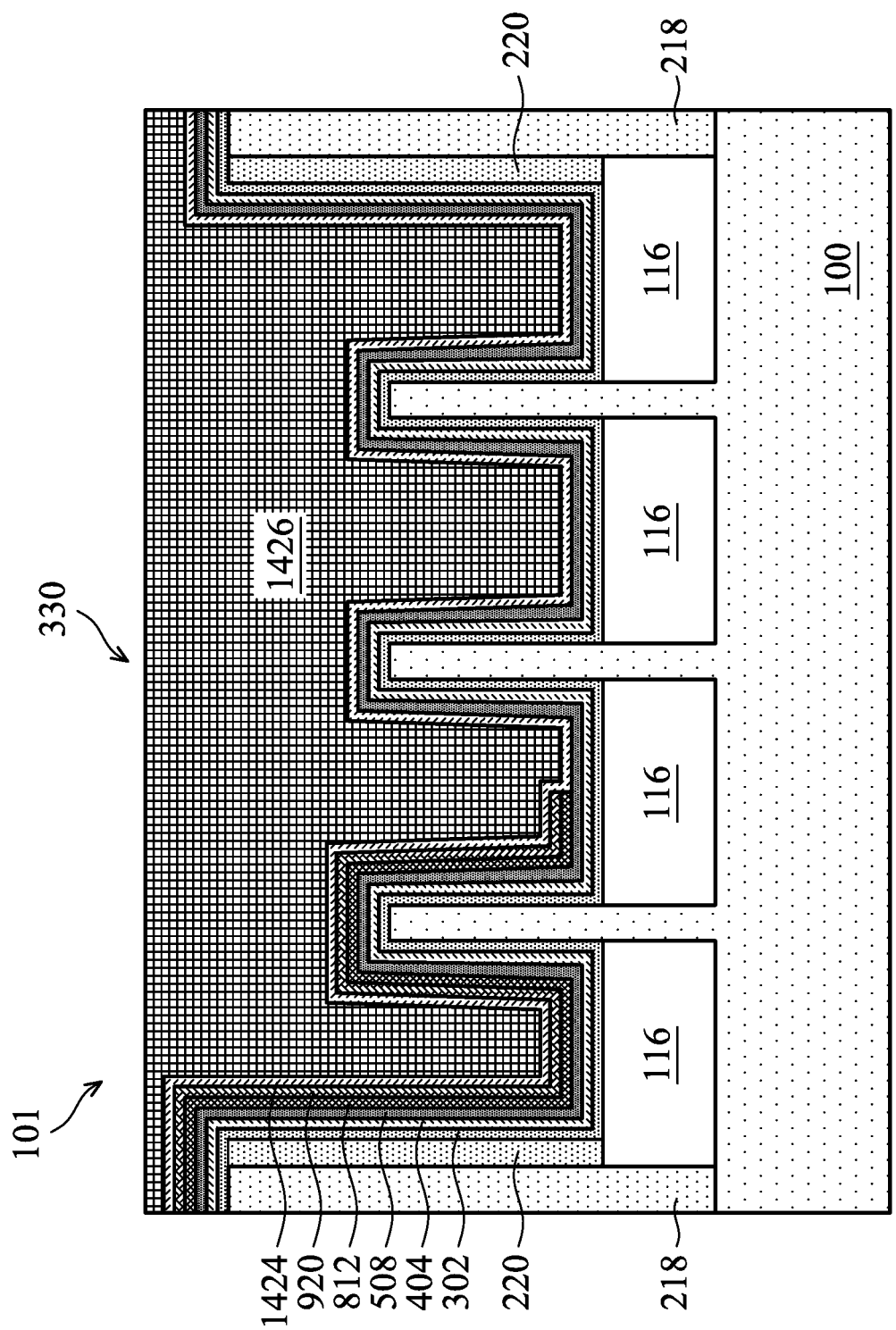
Figure 14B:
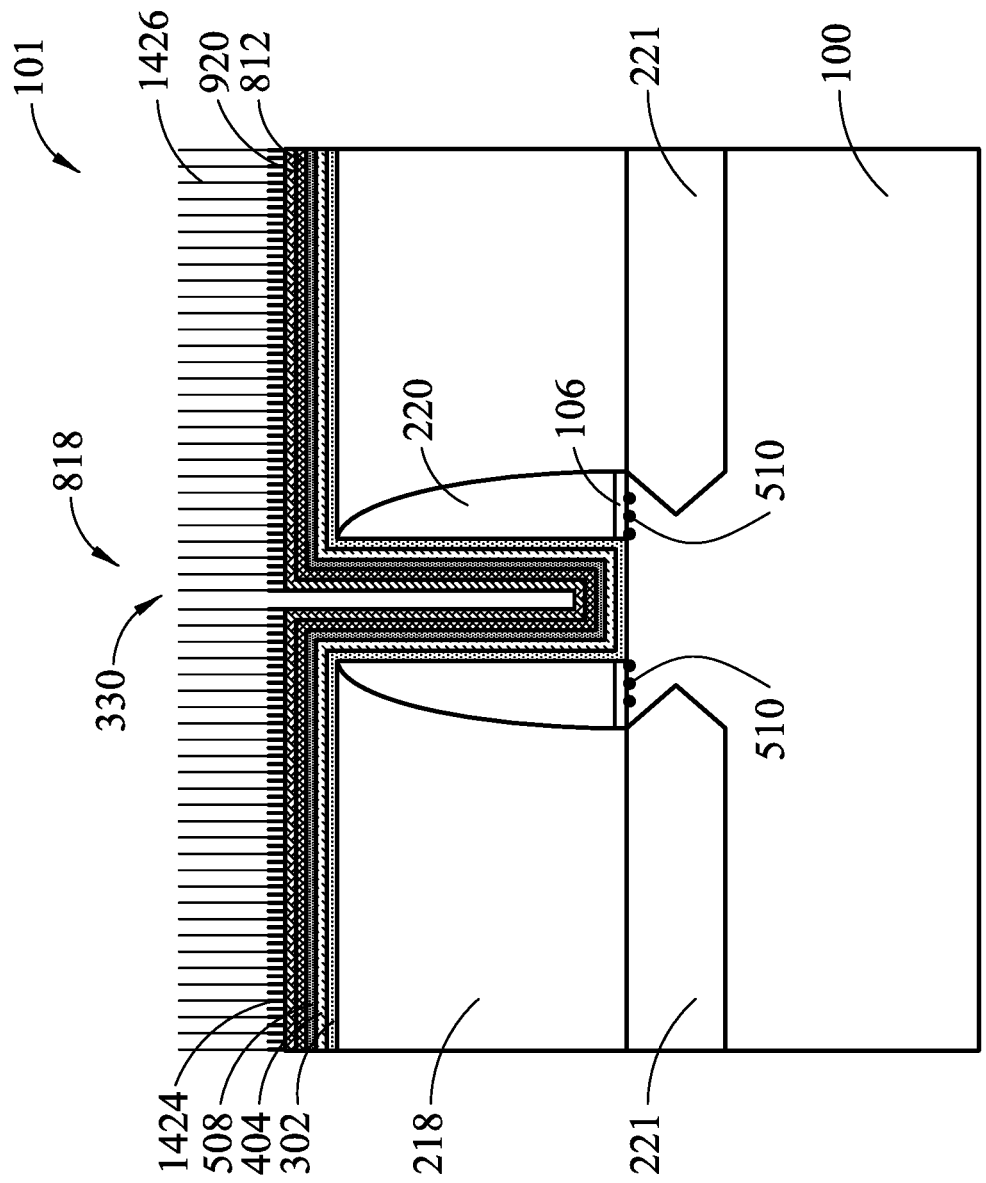
Figure 14C:
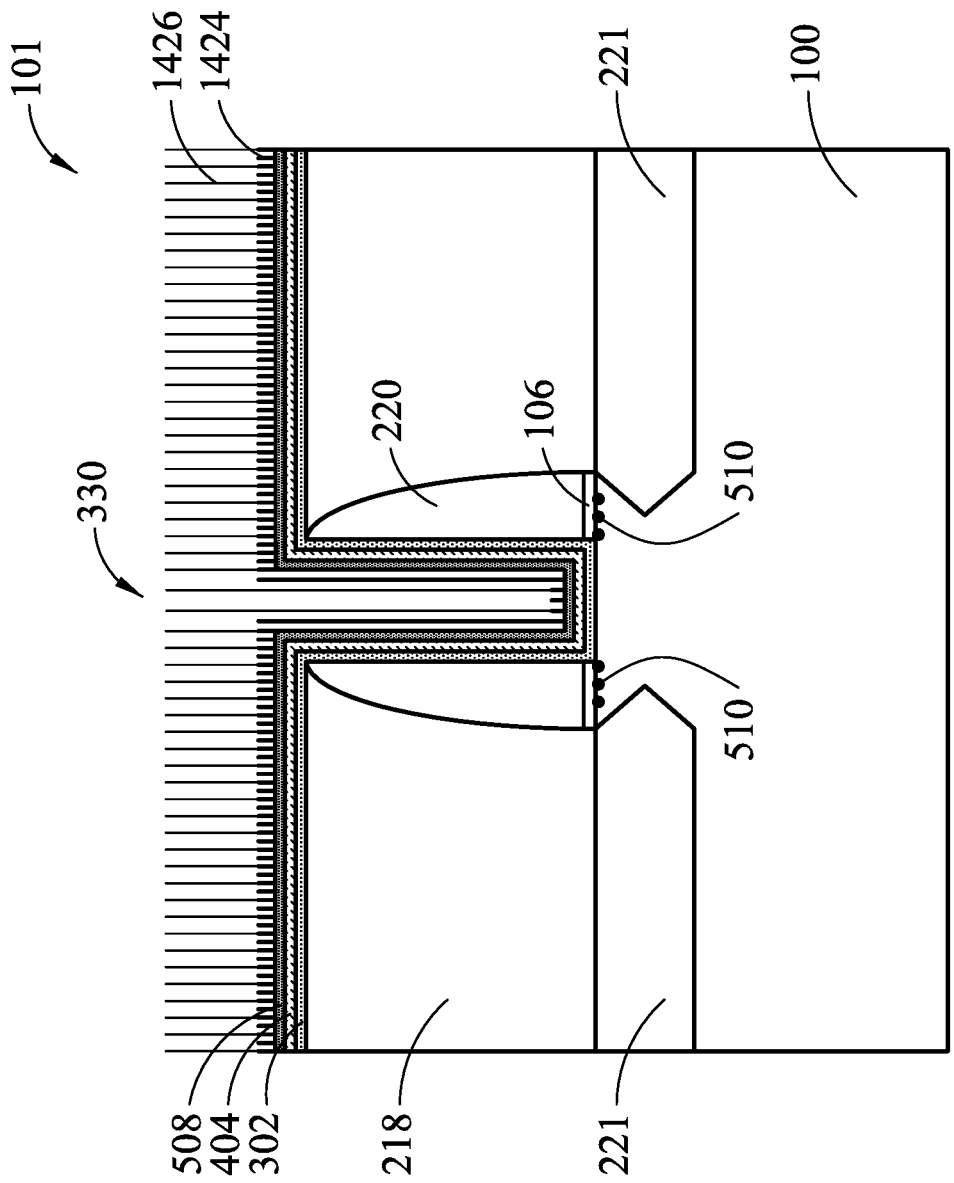

In FIGS. 14A, 14B, and 14C, after removal of the portions of the barrier layer 812 not covered by the third SAM 920 and removal of the trace metal layer 1222 (if performed), a work function tuning layer 1424 is conformally formed on the third SAM 920 in the region 818 and on the first capping layer 404 outside of the region 818, or on the trace metal layer 1222, if not removed.

A work function value is associated with the material composition of the work function tuning layer 1424. By utilizing different materials to fabricate work function tuning layers, the work function value of the replacement gate structures may be more flexibly adjusted and tuned as needed. In some examples, TiN, WN, WCN, AlN, TaAlC, TiAl, TiAlN, WAlN, or other suitable materials, or combinations thereof, are deposited to form the work function tuning layer 1424. The work function tuning layer 1424 may be deposited by ALD, PECVD, MBD, and/or other suitable processes. The thickness of the work function tuning layer 1424 may be altered and adjusted by, for example, increasing or decreasing the number of cycles performed in an ALD.

It may be desirable to have different combinations of work function tuning layers over different fins 102 to have different threshold voltages for the devices formed with those fins 102. The work function tuning layer 1424 and/or any additional work function tuning layers may be deposited and patterned over different fins 102 using further lithography, dry etch, wet etch, and/or ash processes. More particularly, any work function tuning layer can be deposited, and can then be patterned using the processes described above with respect to patterning the barrier layer 812 in FIGS. 8A-C through 13A-C.

Further in FIGS. 14A, 14B, and 14C, after the work function tuning layer 1424 and any other work function tuning layer is formed, a metal fill 1426 is formed filling the openings 330 defined in the gate spacer 220 in the first ILD 218. The metal fill 1426 may include W, Co, Ru, Al, or Cu and/or other suitable materials. The metal fill 1426 may be formed by CVD, PVD, plating, and/or other suitable processes.

Figure 15A:
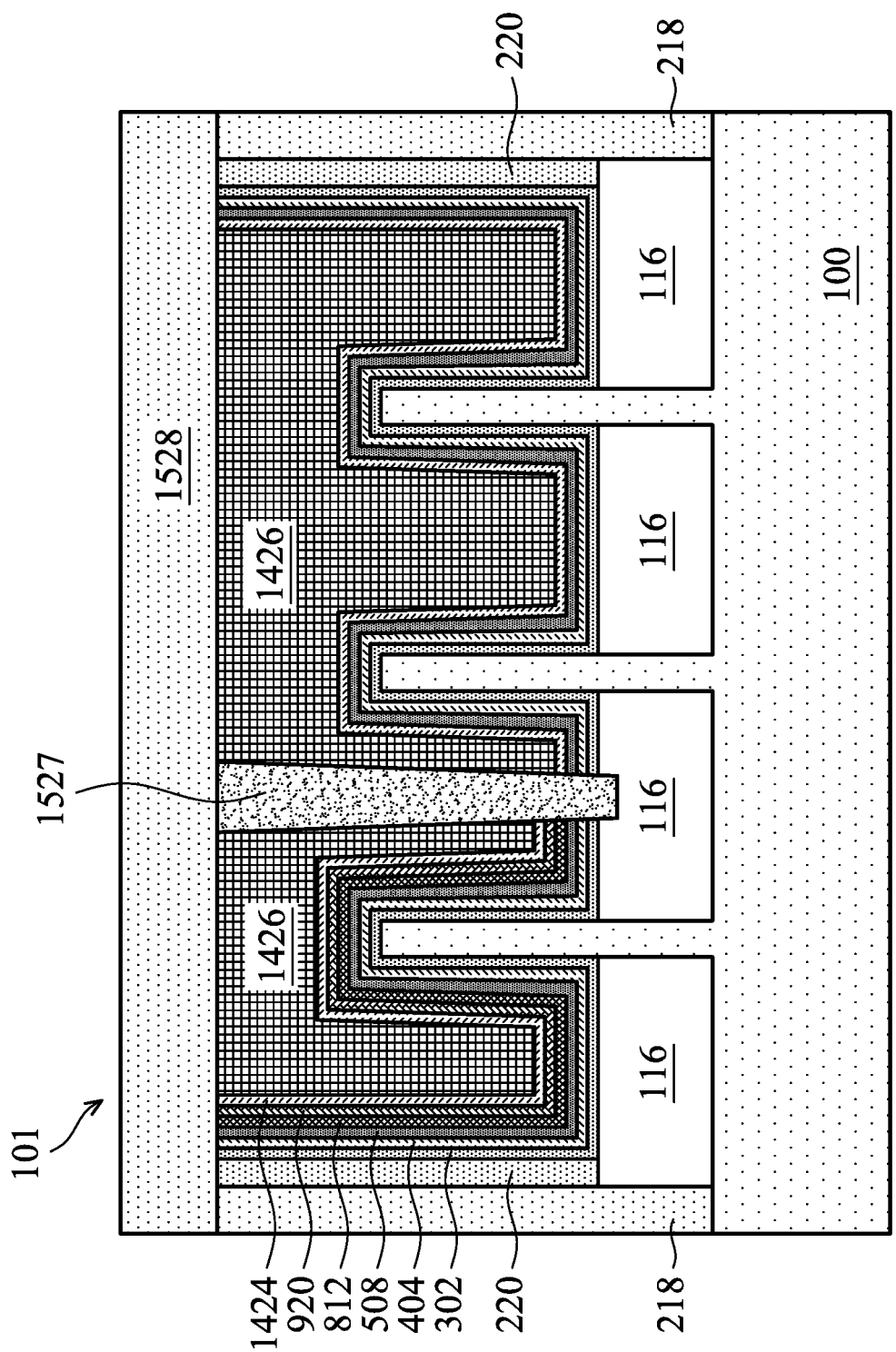
Figure 15B:
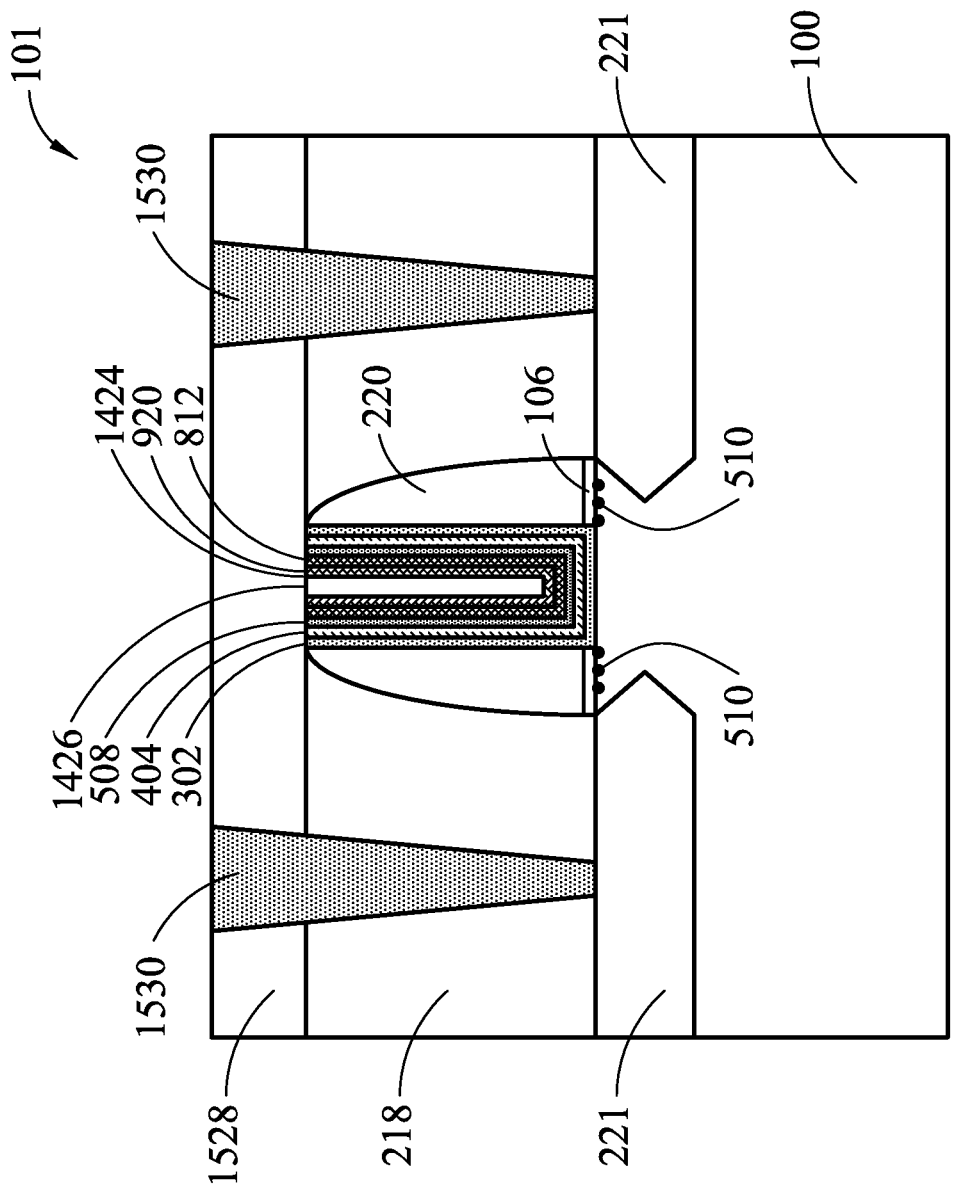
Figure 15C:
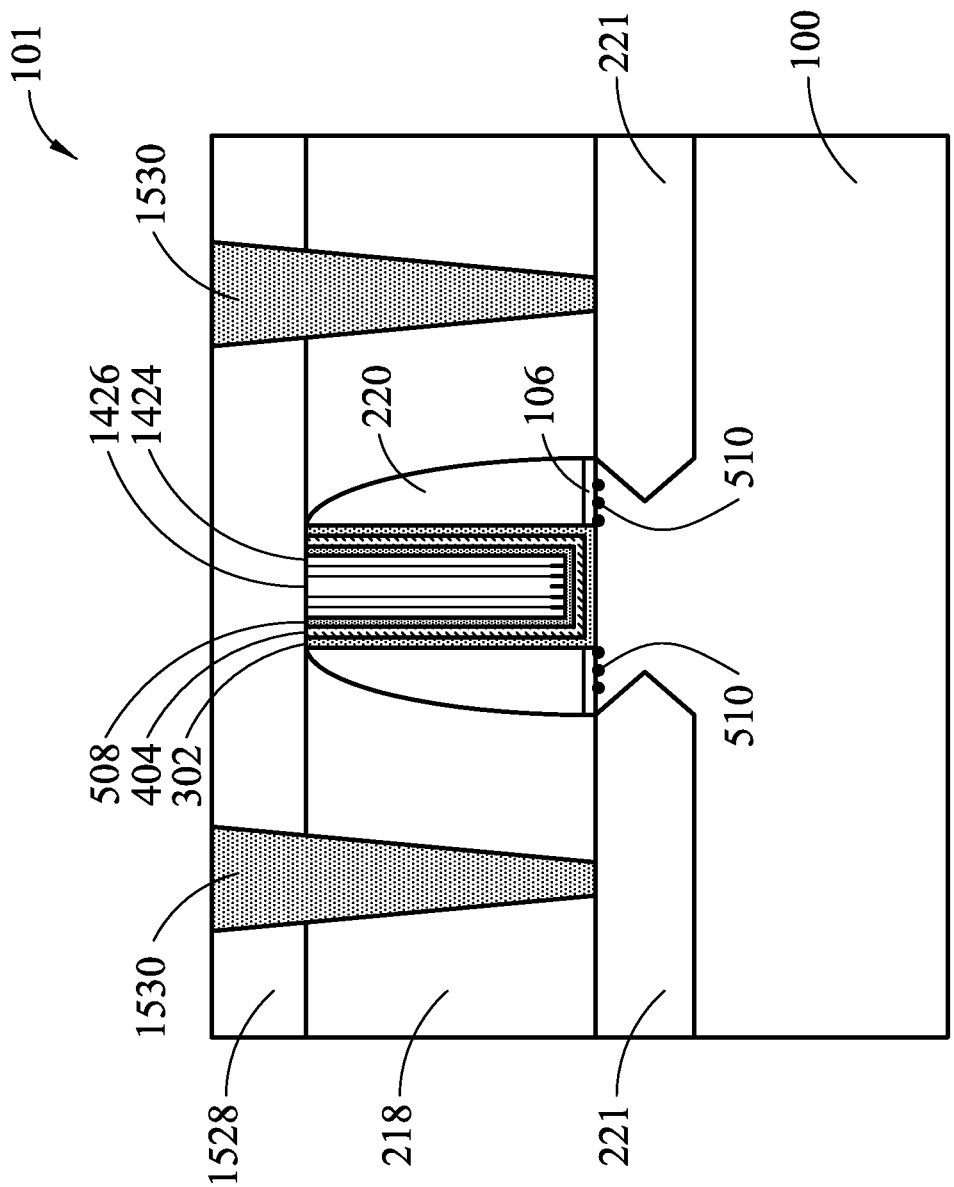

In FIGS. 15A, 15B, and 15C, a CMP process may be performed to remove excess materials from the replacement gate structure so as to planarize a top surface of the device structure 101.

A gate cut process may then be performed. Using appropriate photolithography and etch processes, the replacement gate structure is etched to physically and electrically separate the replacement gate structure into two or more separate replacement gate structures. An opening through the originally formed replacement gate structure, such as into a depth in the isolation structure 116, is etched to separate the replacement gate structures. A dielectric material, such as silicon nitride, silicon oxide, silicon oxynitride, the like, or a combination thereof, is deposited into and filling the opening. A CMP process may be performed to remove excess dielectric material and form a gate-cut fill structure 1527 in the opening that cut the replacement gate structures with a top surface coplanar with top surfaces of, e.g., the replacement gate structures and first ILD 218.

Further in FIGS. 15A, 15B, and 15C, a second ILD 1528 can be formed on the first ILD 218 and over the replacement gate structures. The second ILD 1528 may include materials such as TEOS oxide, un-doped silicate glass, doped silicon oxide such as BPSG, FSG, PSG, BSG, and/or other suitable dielectric materials deposited by any suitable deposition technique.

Respective openings can be formed through the second ILD 1528 and first ILD 218 to the source/drain regions 221. The openings may be formed using suitable photolithography and etch processes. Conductive features 1530 may be formed in openings to the epitaxy source/drain regions 221 as shown in FIGS. 15B and 15C. The conductive features 1530 can include a conformal adhesion and/or barrier layer along sidewalls of the opening (e.g., sidewalls of the first ILD 218 and the second ILD 1528) and a conductive fill material on the adhesion and/or barrier layer to fill the openings. The adhesion and/or barrier layer may be or comprise, for example, titanium, cobalt, nickel, titanium nitride, titanium oxide, tantalum nitride, tantalum oxide, the like or a combination thereof. The conductive fill material may be or comprise tungsten, copper, aluminum, gold, silver, alloys thereof, the like. Silicide regions may also be formed on upper portions of the epitaxy source/drain regions 221. The silicide regions may be formed by reacting upper portions of the epitaxy source/drain regions 221 with the adhesion and/or barrier layer. An anneal can be performed to facilitate the reaction of the epitaxy source/drain regions 221 with the adhesion and/or barrier layer. After the conductive fill material for the conductive features 1530 is deposited, excess material may be removed by using a planarization process, such as a CMP, to form top surfaces of the conductive features 1530 coplanar with the top surface of the second ILD 1528. The conductive features may be referred to as contacts, plugs, etc.

Figure 16:
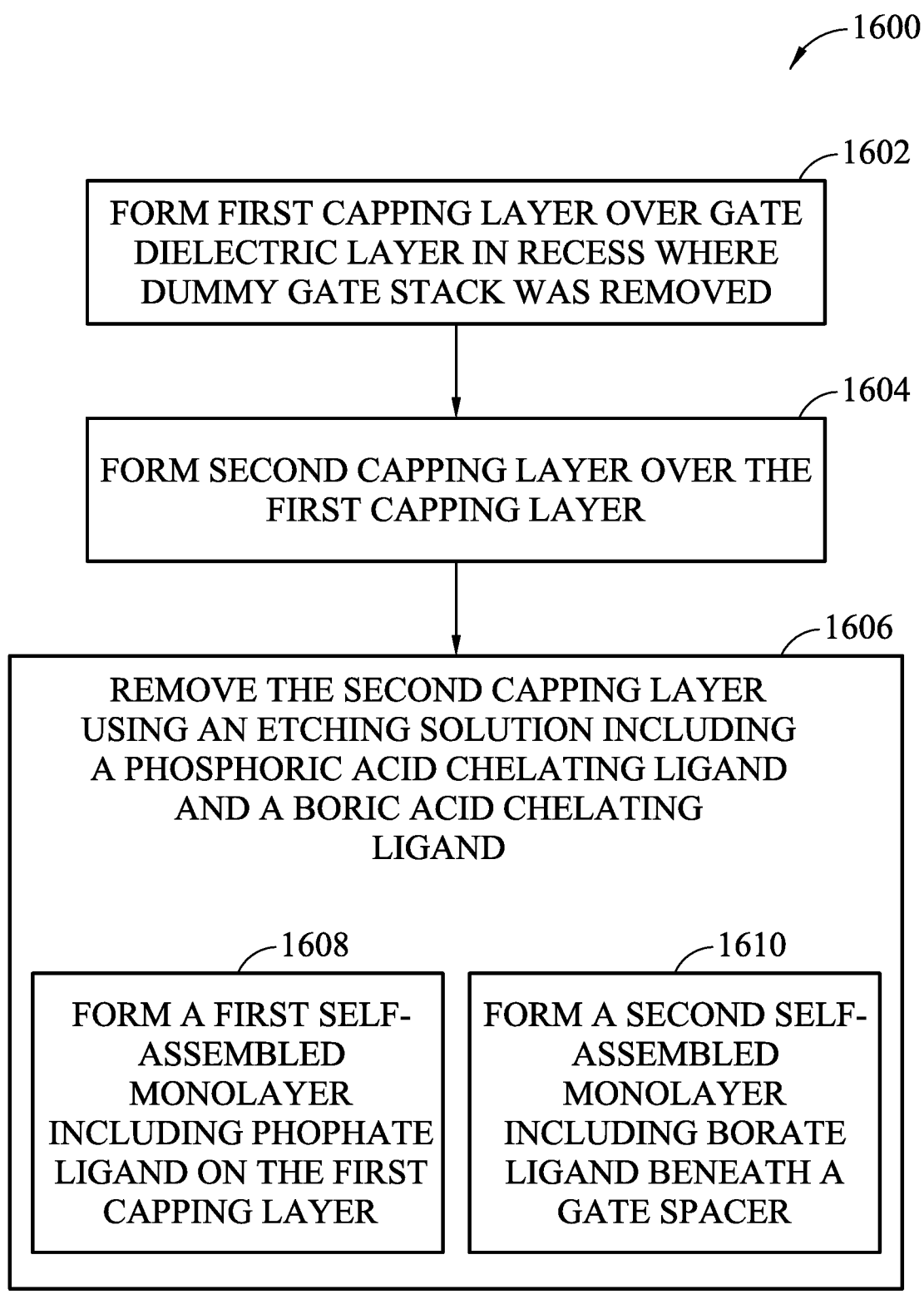
FIG. 16 is a flow diagram illustrating example operations for removal of a capping layer in accordance with some embodiments.

FIG. 16 is a flow chart illustrating example operations 1600 for removing a capping layer with an etch protection mechanism, in accordance with some embodiments. As shown in FIG. 16, at operation 1602, a first capping layer 404 is formed over a gate dielectric layer 302 in a recess 330 where a dummy gate stack 112 was removed, such as in FIGS. 4A and 4B. At operation 1604, the second capping layer 406 is formed over the first capping layer 404, such as also in FIGS. 4A and 4B. At operation 1606, the second capping layer 406 is removed using an etching solution including a phosphoric acid chelating ligand and a boric acid chelating ligand, such as shown in FIGS. 5A and 5B. Reactions with the etching solution result in formation, at operation 1608, of a first SAM 508 including a phosphate ligand on the first capping layer 404, and, at operation 1610, of a second SAM 510 including a borate ligand beneath a gate spacer 220.

Figure 17:
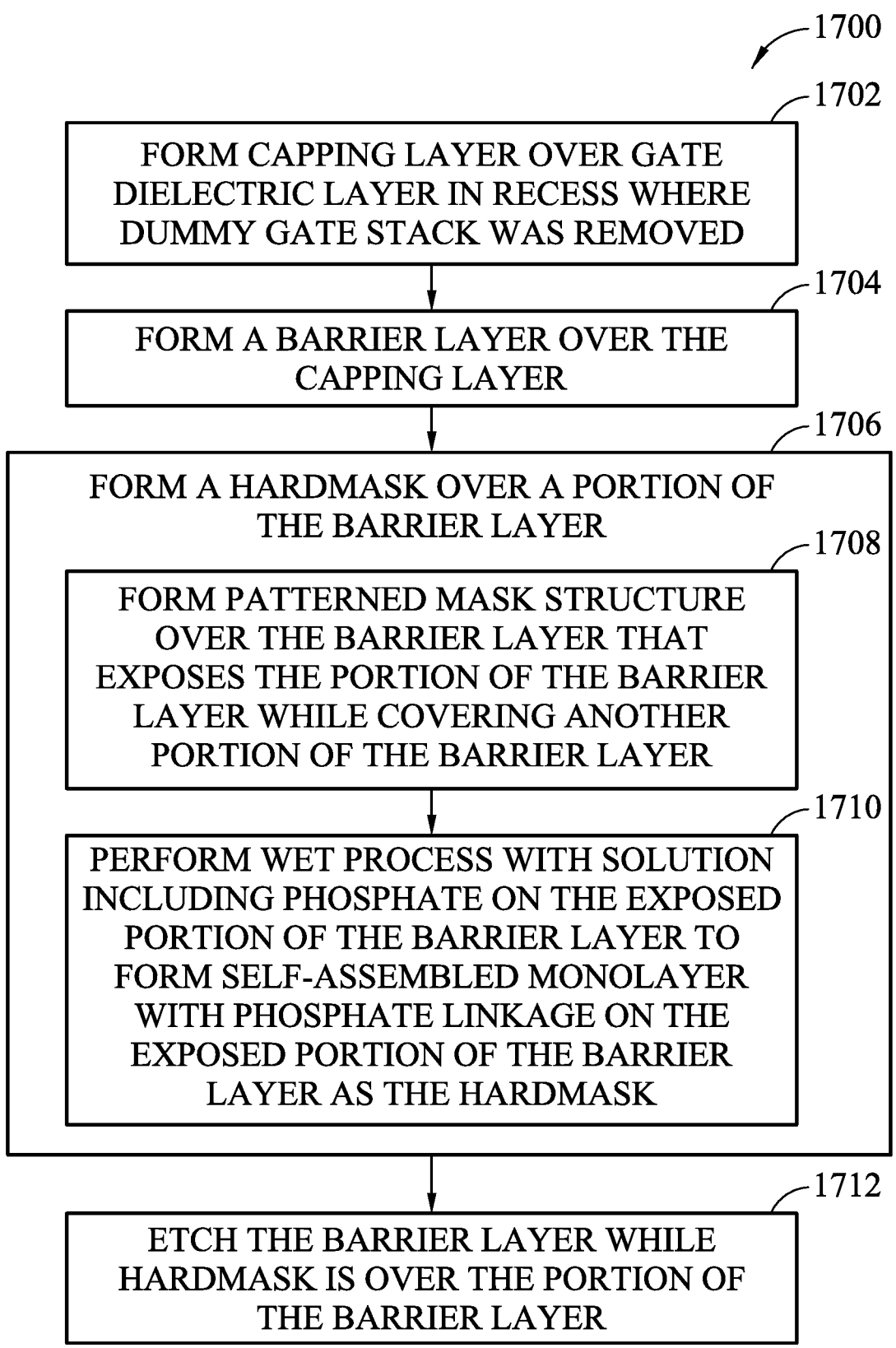
FIG. 17 is a flow diagram illustrating example operations for a wet process assisted approach for barrier layer patterning in accordance with some embodiments.

FIG. 17 is a flow chart illustrating example operations 1700 for using a wet process assisted approach for barrier layer patterning, in accordance with some embodiments. Although the operations 1700 are described in the context of patterning a barrier layer, the operations may likewise be applied to patterning work function tuning layers, as described above. The operations 1700 can be performed in addition to, or separately from, the operations 1600 describe above for removing the second capping layer 406.

As shown in FIG. 17, at operation 1702, a capping layer 404 (and/or SAM 508) is formed over a gate dielectric layer in a recess where a dummy gate stack was removed, as shown in FIGS. 4A and 4B (and/or FIGS. 5A and 5B). At operation 1704, a barrier layer 812 is formed over the capping layer 404 (and/or SAM 508), as shown in FIGS. 8A, 8B, and 8C. At operation 1706, a hardmask is formed over a portion of the barrier layer 812, such as in FIGS. 8A-C and 9A-C. The hardmask is formed by, at operation 1708, forming a patterned mask structure (e.g., including BARC 814 and photoresist 816) over the barrier layer 812 that exposes the portion of the barrier layer 812 (e.g., in region 818) while covering another portion of the barrier layer 812 (e.g., outside of region 818), and by, at operation 1710, performing a wet process. The wet process includes using a solution including phosphate. The wet process is performed on the exposed portion of the barrier layer 812 (e.g., in region 818) to form a SAM 920 with phosphate linkage on the exposed portion of the barrier layer 812 as the hardmask. At operation 1712, the barrier layer 812 is etched while the hardmask (SAM 920) is over the portion of the barrier layer 812, as in FIGS. 11A, 11B, and 11C.

Although not intended to be limiting, one or more embodiments can provide many benefits to a semiconductor device and the formation thereof. For example, embodiments may provide methods for patterning layer layer(s) in a replacement gate process. An etching solution including phosphoric acid and boric acid can be utilized to form different SAMs during removal of a capping layer on a high-k gate dielectric layer. As a result, the wet process may reduce damage to the semiconductor device structure and provide improved electric behavior and lower electric leakage. Another wet process provides for patterning of a barrier metal layer or a work function tuning layer without using a separately deposited layer as the hardmask. As a result, the wet process approach may permit removal of, e.g., the barrier layer with a hardmask layer having a reduced thickness, can allow increased work function tuning layer deposition thickness, which can provide an increased Vt tuning window, and can also avoid damage to the barrier layer and/or work function tuning layer.

In an embodiment, a semiconductor structure includes a fin on a substrate, a gate structure over the fin and along sidewalls of the fin, a gate spacer over the fin and along a sidewall of the gate structure, and a first self-assembled monolayer comprising boron between the fin and the gate spacer. The gate structure includes a gate dielectric layer over the fin and along the sidewalls of the fin, a capping layer over the gate dielectric layer, and a gate metal fill over the capping layer.

Another embodiment is a method for semiconductor processing. A first capping layer is formed over a gate dielectric layer disposed on a fin of a substrate. A gate spacer is disposed over the fin laterally abutting the gate dielectric layer. A second capping layer is formed over the first capping layer. The second capping layer is removed using a wet etching solution. The wet etching solution includes a borate ligand-containing species.

In yet another embodiment, a semiconductor structure includes a fin on a substrate and a gate structure over the fin. The gate structure includes a gate dielectric layer, a metal layer over the gate dielectric layer, a hardmask monolayer comprising phosphorous over the metal layer, and a gate metal fill formed over the hardmask monolayer.

A further embodiment is a method for semiconductor processing. A metal layer is formed over a gate dielectric layer disposed on a substrate. A hardmask monolayer comprising phosphorous is formed over a first portion of the metal layer by exposing the first portion of the metal layer to a wet solution including a phosphorous-containing species. A second portion of the metal layer is removed. The hardmask monolayer prevents removal of the first portion of the metal layer during removal of the second portion of the metal layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor structure comprising:
a fin on a substrate;
a gate structure over the fin and along sidewalls of the fin, wherein the gate structure includes:
a gate dielectric layer over the fin and along the sidewalls of the fin;
a capping layer over the gate dielectric layer; and
a gate metal fill over the capping layer;
a gate spacer over the fin and along a sidewall of the gate structure; and
a first self-assembled monolayer comprising boron between the fin and the gate spacer.

2. The semiconductor structure of claim 1, wherein the first self-assembled monolayer includes a borate ligand reacted to a surface of a material disposed between the gate spacer and the fin.

3. The semiconductor structure of claim 1 further comprising an oxide layer disposed between the gate spacer and the fin, wherein the first self-assembled monolayer includes a species comprising the boron reacted with the oxide layer.

4. The semiconductor structure of claim 1, wherein the gate structure further includes a second self-assembled monolayer comprising phosphorous over the capping layer, the gate metal fill being over the second self-assembled monolayer.

5. The semiconductor structure of claim 4, wherein the second self-assembled monolayer includes a phosphate ligand reacted to a surface of the capping layer.

6. The semiconductor structure of claim 4, wherein the capping layer includes titanium, and the second self-assembled monolayer includes a species comprising phosphorous reacted with the titanium of the capping layer.

7. The semiconductor structure of claim 4, wherein the gate structure further comprises:
a barrier layer over the first self-assembled monolayer; and
a third self-assembled monolayer comprising phosphorous over the barrier layer.

8. The semiconductor structure of claim 4, wherein the second self-assembled monolayer comprises phosphorous.

9. A semiconductor structure comprising:
a fin on a substrate; and
a gate structure over the fin, wherein the gate structure includes:
a gate dielectric layer;
a first capping layer over the gate dielectric layer;
a first hardmask monolayer comprising phosphorous over the first capping layer, wherein the first hardmask monolayer includes phosphate linkage; and
a gate metal fill formed over the first hardmask monolayer.

10. The semiconductor structure of claim 9, wherein the gate structure further includes a trace metal layer comprising at least one of tungsten, niobium, molybdenum, or a combination thereof over the first hardmask monolayer, the gate metal fill being over the trace metal layer.

11. The semiconductor structure of claim 9 further comprising:
a barrier layer over the first hardmask monolayer; and
a second hardmask monolayer over the barrier layer, wherein the gate metal fill is over the second hardmask monolayer.

12. The semiconductor structure of claim 11, wherein the second hardmask monolayer comprises phosphorous.

13. The semiconductor structure of claim 12, wherein the second hardmask monolayer comprises titanium.

14. The semiconductor structure of claim 9 further comprising:
a gate spacer adjacent the gate structure; and
a third self-assembled monolayer comprising boron between the fin and the gate spacer.

15. A semiconductor structure comprising:
a fin on a substrate;
a gate structure over the fin and along sidewalls of the fin, wherein the gate structure includes:
a gate dielectric layer over the fin and along the sidewalls of the fin;
a capping layer over the gate dielectric layer;
a first monolayer comprising phosphorous over the capping layer; and
a gate metal fill over the capping layer;
a gate spacer over the fin and along a sidewall of the gate structure; and
a second monolayer comprising boron between the fin and the gate spacer.

16. The semiconductor structure of claim 15, wherein the second monolayer includes a borate ligand reacted to a surface of a material disposed between the gate spacer and the fin.

17. The semiconductor structure of claim 16, wherein the first monolayer includes a phosphate ligand reacted to a surface of capping layer.

18. The semiconductor structure of claim 17, further comprising a barrier layer over the capping layer and a third monolayer over the barrier layer, wherein the gate metal fill is over the third monolayer.

19. The semiconductor structure of claim 18, wherein the third monolayer comprises a phosphate ligand reacted to a surface of barrier layer.

20. The semiconductor structure of claim 9, wherein the first capping layer comprises a titanium-containing material.

* * * * *